US011966286B2

(12) United States Patent
Bains et al.

(10) Patent No.: US 11,966,286 B2
(45) Date of Patent: Apr. 23, 2024

(54) READ RETRY TO SELECTIVELY DISABLE ON-DIE ECC

(71) Applicant: Intel Corporation, Santa Clara, CA (US)

(72) Inventors: Kuljit S. Bains, Olympia, WA (US); Rajat Agarwal, Portland, OR (US); Jongwon Lee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/715,771

(22) Filed: Apr. 7, 2022

(65) Prior Publication Data

US 2022/0229724 A1 Jul. 21, 2022

Related U.S. Application Data

(63) Continuation of application No. 16/875,642, filed on May 15, 2020, now Pat. No. 11,314,589.

(51) Int. Cl.
*G06F 11/10* (2006.01)
*G11C 11/4096* (2006.01)

(52) U.S. Cl.
CPC ...... *G06F 11/1044* (2013.01); *G06F 11/1072* (2013.01); *G11C 11/4096* (2013.01)

(58) Field of Classification Search
CPC ............. G06F 11/1044; G06F 11/1072; G06F 11/1052; G11C 11/4096; G11C 7/1045; G11C 11/4076
See application file for complete search history.

(56) References Cited

U.S. PATENT DOCUMENTS

| | | | | |
|---|---|---|---|---|
| 9,811,420 | B2 | 11/2017 | Das et al. | |
| 9,817,714 | B2 | 11/2017 | Halbert et al. | |
| 10,496,473 | B2 | 12/2019 | Das et al. | |
| 10,872,011 | B2 | 12/2020 | Bains et al. | |
| 2013/0080858 | A1 | 3/2013 | Lee et al. | |
| 2017/0110178 | A1 | 4/2017 | Bains | |
| 2019/0347158 | A1* | 11/2019 | Chung | G06F 11/1044 |
| 2020/0133769 | A1 | 4/2020 | Bains | |
| 2020/0401476 | A1* | 12/2020 | Cha | G06F 13/1668 |
| 2021/0182219 | A1 | 6/2021 | Benisty | |

OTHER PUBLICATIONS

Extended European Search Report for Patent Application No. 20216306.9, dated Jun. 9, 2021, 8 pages.
First Office Action for U.S. Appl. No. 16/875,642, dated Jul. 21, 2021, 6 pages.
Notice of Allowance for U.S. Appl. No. 16/875,642, dated Dec. 27, 2021, 5 pages.

* cited by examiner

*Primary Examiner* — Thien Nguyen
(74) *Attorney, Agent, or Firm* — Compass IP Law PC

(57) ABSTRACT

A memory device that performs internal ECC (error checking and correction) can selectively return read data with application of the internal ECC or without application of the internal ECC, in response to different read commands from the memory controller. The memory device can normally apply ECC and return corrected data in response to a normal read command. In response to a retry command, the memory device can return the read data without application of the internal ECC.

20 Claims, 11 Drawing Sheets

READ RETRY TO SELECTIVELY DISABLE ON-DIE ECC

PRIORITY

The present application is a continuation of, and claims the benefit of priority of, U.S. application Ser. No. 16/875,642, filed May 15, 2020.

FIELD

Descriptions are generally related to memory devices, and more particular descriptions are related to selectively application of internal error checking and correction (ECC).

BACKGROUND

The error handling in a memory subsystem can be referred to as RAS (reliability, availability, serviceability), referring to the error handling used to meet RAS expectations. RAS expectations often include an expectation for a full SDDC (single device data correction) capability, where an error resulting from a full device failure can be corrected. However, future generation memory subsystems will not have enough ECC (error checking and correction) bits to provide full SDDC, as more data is provided from fewer devices. Whereas ×4 (4-bit wide data interface per device) DRAM (dynamic random access memory) devices under DDR4 (double data rate, version 4, JESD79-4, originally published in September 2012 by JEDEC) provide 4B (four bytes) of data from a single device, DDR5 (DDR version 5, currently in discussion by JEDEC) ×4 DRAM devices provide 8B of data from a single device. For HBM (e.g., high bandwidth memory DRAM, JESD235A, originally published by JEDEC in November 2015), a single device provides all 32B of read data.

Furthermore, although on-die ECC can generally provide correction of single-bit errors (SBE), when a device has a multibit error (MBE), the memory device ECC circuitry can generate additional errors by mis-correcting the MBE as a SBE. Such mis-correction is referred to as aliasing, where an ECC syndrome generated based on a multibit error matches a column of the code matrix, resulting in flipping a correct bit in error. Thus, for example, a 2-bit error can be "corrected" by internal ECC into a 3-bit error.

The memory controller may be capable of applying more robust ECC at the system level by applying the data from multiple memory devices. However, aliasing can result in uncorrectable errors that the memory controller could otherwise correct.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1:
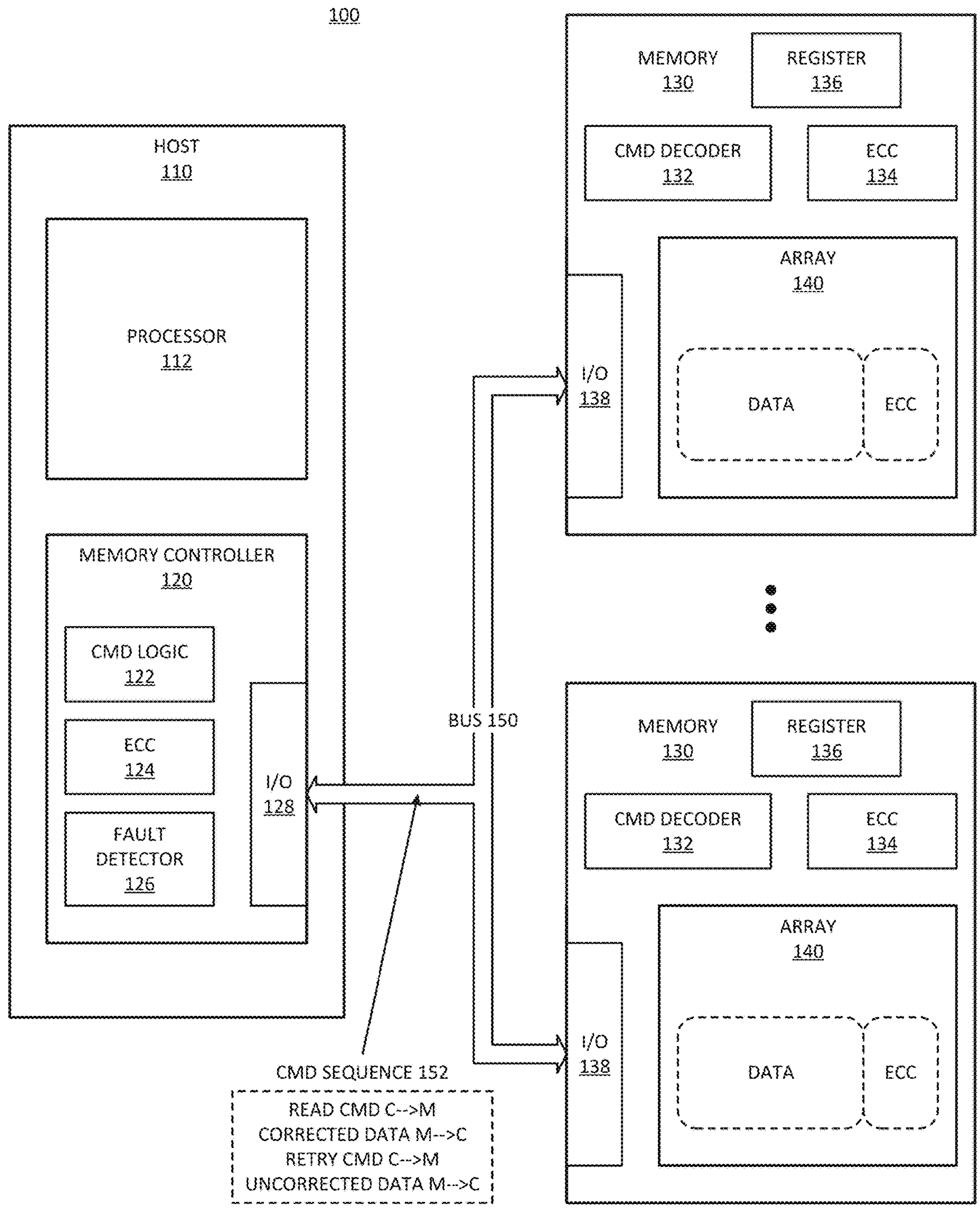
FIG. 1 is a block diagram of an example of a system in which a host selectively provides a command to perform a retry read in which the memory disables on-memory ECC.

Descriptions of certain details and implementations follow, including non-limiting descriptions of the figures, which may depict some or all examples, and well as other potential implementations.

DETAILED DESCRIPTION

As described herein, a memory device that performs internal ECC (error checking and correction) can selectively return read data with application of the internal ECC or without application of the internal ECC, in response to different read commands from the memory controller. The memory device can normally apply ECC and return corrected data in response to a normal read command. In response to a retry command, the memory device can return the read data without application of the internal ECC.

Subsequent generations of memory devices are expected to have a much smaller ratio of data signal lines per device to the total number of bits per read operation (shrinking channels). Additionally, ECC bits are sometimes repurposed for poisoning, directories, security, or other applications. Thus, it is unlikely there will be enough ECC bits to provide full SDDC (single device data correction) capability in future generations of memory devices. Achieving the same RAS (reliability, availability, serviceability) expectations within the memory system will rely on ECC operations by the host or memory controller. The operation by the memory controller is hampered by ECC aliasing, which can be countered by the selective use of internal ECC by the memory devices.

A retry read command that results in the memory device sending data without internal ECC (e.g., SBE (single bit error) correction) enabled will allow the host to receive data from a specific memory device without mis-corrections. The host can compare aliased corrected data with the uncorrected data to identify errors introduced by internal ECC. Such operation can enable the host to convert DUE (detectable, uncorrectable error) errors into CE (correctable error) errors. As such, the host can improve the RAS coverage for the memory subsystem. RAS coverage can be targeted, for example, for up to 16 b (bits) or up to 32 b, depending on the memory architecture.

Testing of a 32 GB (gigabyte) ×4 RDIMM (registered dual inline memory module) indicated that full device failure is not a common mode of failure. For errors that could be identified, SBEs far outnumbered any other errors. The rate of SBEs continues to increase in memory devices due to smaller patterning and feature size shrinkage, as well as the use of VRT (variable retention time). The next most common were MBE (multibit error), followed by row errors (or cacheline errors). Internal ECC or on-die ECC is generally effective at addressing SBEs but can alias MBEs into DUE errors.

In one example, the memory controller generates a retry command (alternatively, a read retry command or retry read command) in response to detection of a DUE in data from a group of memory devices. For example, as part of the application of internal ECC, the memory device could generate a DUE indication when the internal ECC results in the detection of an error that the memory device cannot correct internally. In one example, the memory controller can detect the DUE from receipt of data and ECC check bits from the memory device.

There are different mechanisms the memory controller could use to generate the retry command. In one example, the memory controller places the memory device or group of memory devices in a read retry mode or equivalent, where the memory controller sets one or more configuration bits of the memory devices. The configuration bit or bits could be, for example, a field in a mode register or other configuration register.

In one example, the memory controller and memory device include a retry command encoding as part of the command protocol. For example, whereas a standard Read command will be defined by a specific encoding of CA (command and address) bits, a Read Retry command could also be defined. It will be understood that such a Read Retry command could be included in a command protocol with other commands, such as Read, Write, Refresh, or other commands. The command encoding would need to be different from other commands in the protocol, unless the command is used in conjunction with a retry mode triggered by a configuration setting.

In one example, the memory controller triggers a retry command by back-to-back or sequential Read commands. Back-to-back command or a sequence of the same command can refer to memory controller issuing the same command without any intervening command. Certain intervening command could be permissible by protocol. In one example, issuing the "same command" refers to the same command encoding with the same address. Thus, the encoding can include a sequence of identical CA bit encoding.

In one example, for the back-to-back Read command mechanism to function, the memory device can include circuitry to decode the command as the same command. Thus, the memory device can internally decode the sequential commands as a trigger for the Read command. If the purpose of the Retry command is to provide uncorrected data to compare to previous corrected data, the sequential commands can result in the memory device returning data in response to decoding the original Read command, followed by decoding the Retry command, and returning the same data without application of internal ECC.

It will be understood that the memory controller can be coupled to a single memory device. However, system-level correction by the memory controller would not be different at the host for a single memory device. Typically, memory devices are used as a group. The memory controller couples to multiple memory devices or a group of memory devices over a memory channel, where the memory devices share (e.g., with a multidrop bus) the command and address signal lines, and each memory device has dedicated data lines (DQ and associated strobe or clock (DQS) lines) coupled between the memory device and the memory controller. Other control signal lines can also be either shared (e.g., multiple devices in a rank can share device enable (EN) signal lines or an ALERT signal line) or unique.

FIG. 1 is a block diagram of an example of a system in which a host selectively provides a command to perform a retry read in which the memory disables on-memory ECC. System 100 represents elements of a computer system. System 100 can be considered to illustrate elements of a memory system or memory subsystem, if the memory system is considered a portion of the computer system.

System 100 includes host 110, which represents a hardware and software platform for the computer system that includes the memory. Host 110 includes processor 112, which can be any type of processor, microprocessor, central processing unit (CPU), graphics processing unit (GPU), or other controller or processor that executes instructions that result in requests for access to memory. Processor 112 can be a single core processor. In one example, processor 112 is a multicore processor.

Host 110 includes memory controller 120 to represent circuitry in host 110 to manage the access to memory 130. In one example, memory controller 120 is part of a processor die (integrated memory controller or on-die controller). In one example, memory controller 120 is circuitry integrated onto a system on a chip (SOC) that includes processor 112 and memory controller 120. Such an SOC could also include peripheral controllers, communication controllers, graphics controllers, or other circuitry.

In one example, memory controller 120 includes command (CMD) logic 122, which represents logic to generate commands to memory 130 in response to a request by processor 112 for memory access. Command logic 122 can include circuitry on memory controller 120 as well as firmware or code logic. In one example, command logic 122 can generate a command with command encoding to trigger a retry command by memory 130. Based on encoding of the command by command logic 122, in one example, command (CMD) decoder 132 of memory 130 will interpret a command as a retry command to cause the memory device to return read data without application of internal ECC.

Memory controller 120 includes ECC 124, which represents error checking and correction logic at the host side. ECC 124 performs system-level ECC, which refers to error checking and correction for data received from multiple memory devices 130. In one example, ECC 124 includes circuitry to execute ECC operations on data received from memory 130. In one example, ECC 124 generates ECC check bits to send with write data for a write command.

Memory controller 120 includes I/O (input/output) 128, which represents hardware to interface with memory 130. The hardware can include pins, balls, or other connectors to interface with signal lines on a connecting substrate (e.g., an SOC or a motherboard) of system 100 that provides electrical interconnection of memory controller 120 with memory 130. The hardware of I/O 128 can include drivers and receive circuitry (including termination hardware, clock/timing circuits, signal phase control such as delay lock loops (DLL) or phase lock loops (PLL), or other hardware).

Memory 130 represents an individual memory device, such as a DRAM (dynamic random access memory) device or SDRAM (synchronous DRAM) device. System 100 illustrates multiple memory devices, each labeled as memory 130. Memory 130 includes I/O 138, which represents hardware of the memory device to interface with and communicate with memory controller. Bus 150 represents one or more groups of signal lines or traces to electrically/communicatively connect memory 130 with memory controller 120. The hardware of I/O 138 can be the same or similar to I/O 128 of memory controller, and will not be described separately.

Memory 130 includes command (CMD) decoder 132, which represents circuit elements and logic to decode a command received from memory controller 120. A command can include a Read command, a Write command, a Refresh command, or other commands. In one example, command decoder 132 includes logic to decode a retry command.

Memory 130 includes ECC 134, which represents on-die ECC or on device ECC. ECC 134 operates within memory 130 to correct data errors for data before memory 130 provides the data to memory controller 120. The operation of ECC 134 of memory 130 will be understood to be different from the operation of ECC 124 of memory controller 120. Memory controller 120 computes ECC and sends check bits that can be stored in one or more of the multiple memory devices. Some of the memory devices will store only data, and other may store only ECC check bits. For example, common architectures includes 10×4, or 10 memory devices with 8 to store data and 2 to store ECC information, where the memory devices have a ×4 data interface. Adding more devices for ECC adds cost with increased parts, as well as increasing the channel pinout for additional signal lines to connect to the additional device(s).

Thus, ECC 124 performs ECC for all data bits send in total to all the memory devices. ECC 134 operates within memory 130 to check and correct errors within the memory device prior to returning the portion of bits stored in the memory device. It will be understood that the RAS performance of the system-level ECC is expected to be higher than that of ECC within an individual device due to the availability of more ECC information.

Memory 130 includes register 136, which represents a configuration register of memory 130. For example, register 136 can be a mode register. Register 136 includes one or more fields to store configuration information for memory 130. In one example, register 136 includes a field to store one or more bits of information that memory controller 120 can set to place memory 130 into a retry command mode. The retry command mode can be specific mode or state of operation for memory 130. In the retry command mode, when command decoder 132 receives a read command, it decodes the read command as a command to trigger a read without application of ECC 134. Thus, memory 130 will read the data from array 140 and return it to memory controller 120 without application of internal ECC. Such a mode can be an alternative to a retry command based on command encoding by command logic 122.

Memory 130 includes array 140 to store data. Array 140 represents an array of addressable memory locations. Typically, array 140 is addressable at least by row (e.g., wordline) and column (e.g., bitline). Array 140 can be subdivided into various banks or sub-banks, or other divisions. Array 140 stores data and ECC data. It will be understood that data can include data written from memory controller 120. In one example, some or all of the data written by memory controller to a selected memory device can be system ECC data. ECC within array 140 represents local ECC data or ECC check bits generated by ECC 134 for internal ECC.

Bus 150 provides electrical and communicative connection between memory controller 120 and memory 130. The dashed box pointing to bus 150 illustrates one example of a command (CMD) sequence 152. Command sequence 152 will be understood as one nonlimiting example of a command sequence where a retry command is used.

In one example, a Read command is sent from memory controller 120 to memory 130 (controller to memory, or C->M). In response to the Read command, memory 130 accesses data from array 140 and applies ECC operations on the codeword data plus local or internal ECC check bits with ECC 134. After the application of internal ECC, memory 130 returns corrected data to memory controller 120 (memory to controller, or M->C).

In one example, the "corrected" data simply refers to data that has been check and corrected by ECC 134, and does not necessarily mean data free from errors. ECC 134 can be effective at correcting SBEs, but could alias an additional bit error when data read from array 140 already had an MBE. In one example, memory 130 can generate an indication with ECC 134 when data could not be properly corrected, such as issuing a DUE indication. In one example, memory controller 120 receives the read data and detects the DUE.

In one example, memory controller 120 sends a retry command to memory 130 in response to detection of an uncorrected or uncorrectable error or detect of another error in data from memory 130 that is supposed to have already been corrected. The retry command triggers memory 130 to re-read the same data and return uncorrected data to memory controller 120 without application of ECC 134.

In one example, memory controller 120 includes fault detector 126. In one example, after sending a retry command, memory controller 120 can perform fault detection with fault detector 126 to determine which memory device returned the data with the error. Standard fault detection or proprietary fault detection can be used. The specific process of fault detection is outside the scope of this disclosure. Fault detector 126 enables memory controller 120 to identify an uncorrected error and perform system-level ECC to provide correction on the data.

In one example, memory controller 120 can use a retry command on all data to isolate single bit errors. In such an example, with a command encoding or a retry mode, the application of a retry command is not necessarily in response to detection of an error. Thus, the retry command could be issued without first sending a regular Read command. In runtime operation of the memory device, in one example, a retry command is not sent until after a read command has been sent. In one example, memory controller 120 can generate a map of SBEs to enable better RAS coverage. In one example, based on the map of errors and other fault detection, memory controller 120 can take pages offline based on detection of too many errors.

Figure 2:
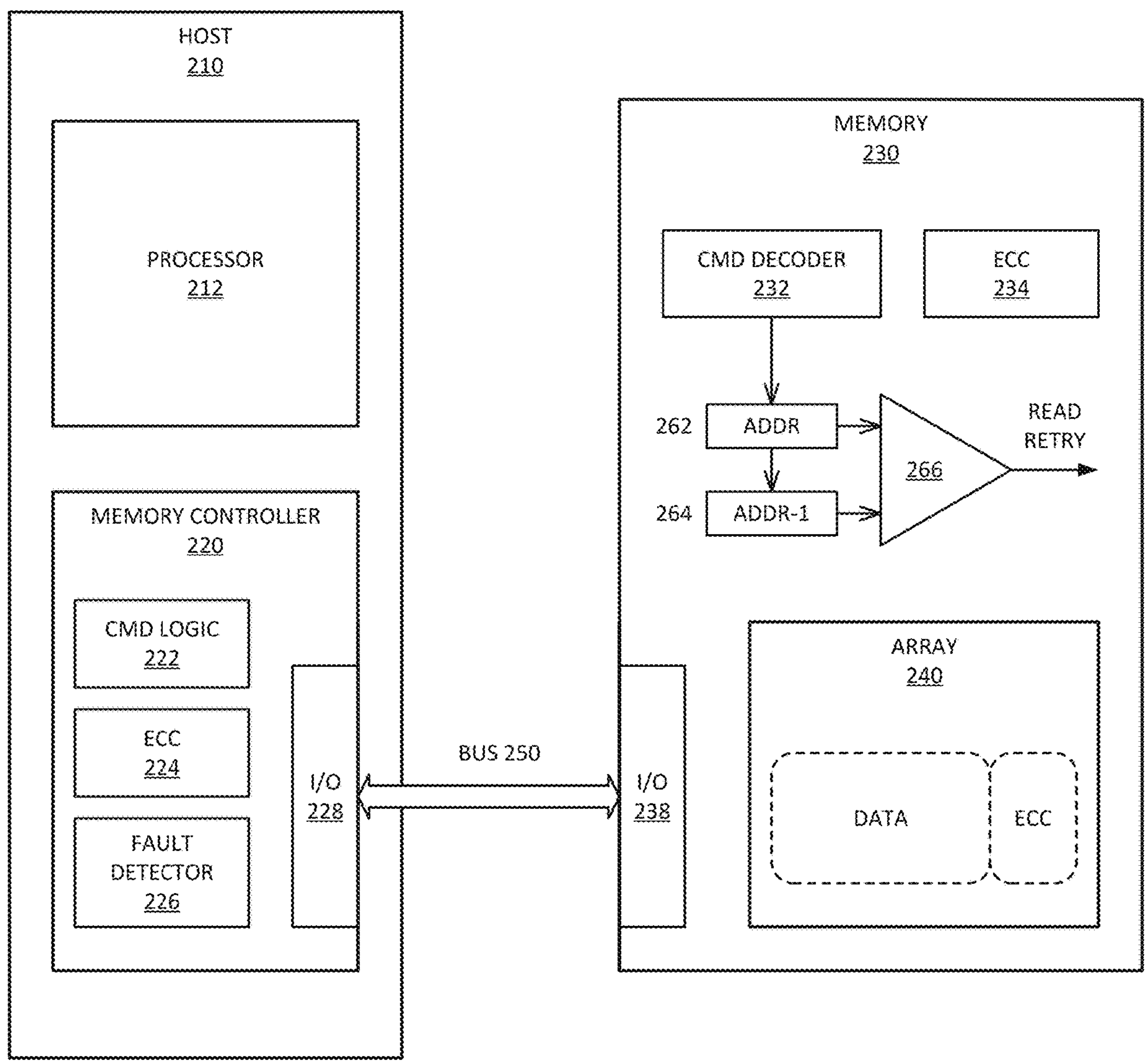
FIG. 2 is a block diagram of an example of a system in which a host selectively provides a command to perform a retry read in which the memory disables on-memory ECC based on a repeat read command.

FIG. 2 is a block diagram of an example of a system in which a host selectively provides a command to perform a retry read in which the memory disables on-memory ECC based on a repeat read command. System 200 provides an example of a system in accordance with system 100 of FIG.

1. System 200 more specifically illustrates an architecture for a retry command indicated by a sequence of repeat read commands. Only one memory device is illustrated for simplicity, but it will be understood that more than one memory device can be used, and a typical implementation will include multiple memory devices.

Host 210 represents a host platform for system 200. Host 210 includes processor 212 and memory controller 220. The descriptions above with respect to processor 112 of system 100 can also apply to processor 212 of host 210. The descriptions above with respect to memory controller 120, command logic 122, ECC 124, fault detector 126, and I/O 128 of system 100 can also apply to memory controller 220, ECC 124, fault detector 126, and I/O 228 of system 200, respectively.

The descriptions above with respect to memory 130, command decoder 132, ECC 134, I/O 138, and array 140 of system 100 can also apply to memory 230, command (CMD) decoder 232, ECC 234, I/O 238, and array 240, respectively. Similarly, the descriptions of bus 150 above can apply to bus 250.

With respect to command (CMD) logic 222, command logic 222 issues a retry command by issuing back to back read commands to the same address. While a command sequence on bus 250 is not specifically illustrated, the same command sequence as what is described with respect to bus 150 can apply for bus 250. The retry command in the sequence is more specifically a retry command triggered by repetition of a read command for system 200.

In one example, memory 230 includes address registers or other storage elements to store address data for read commands. In one example, when command decoder 232 detects a read command, the decoder triggers memory 230 to store the address of the read command (ADDR) in register 262. Memory 230 can compare the address of register 262 with a prior read address (ADDR-1) in register 264. Comparator 266 can determine if the addresses are the same and issue a ready retry output in response to the comparison.

In one example, the comparison occurs only in response to consecutive read commands. Thus, for example, the operation of comparator 266 can be enabled (or gated) based on another comparison that the current command is the same as the prior command. In one example, the circuitry of memory 230 stores the address of every access command in register 262, and on the next access command pushes the address to register 264 to be replaced with the address of the next access command. In such an implementation, memory 230 can include additional circuitry to control the read retry decoding, such as gating the read retry output with a determination that the command is a read command, or that the command is a read command and the prior command was also a read command (e.g., an indication that two read commands were received back-to-back). Such logic can be gated with the output, or used by circuitry within comparator 266 to generate the read retry encoding output.

Similar or additional logic can be added to ensure that no intervening commands were received. For example, memory 230 can include circuitry to ensure that the decoding of consecutive commands only results in a read retry when there are no intervening commands received between the two read commands, such as a current command and a subsequent read command, which could alternatively be considered a current read command and a prior read command. When referring to intervening commands, it will be understood that a read command followed by a CAS command can be considered one read command. Thus, the CAS command would not be considered an intervening command for purposes of the comparison when the CAS command is part of the sequence of triggering the execution of a read operation.

Thus, in one example, memory 230 compares a read command address to a previous read command address. If the read command addresses match, in one example, memory 230 can access data from array 240 and return it to memory controller 220 as raw data, without the application of ECC by ECC 234. Such an operation can provide a retry command without new command encoding or a retry mode.

Figure 3A:
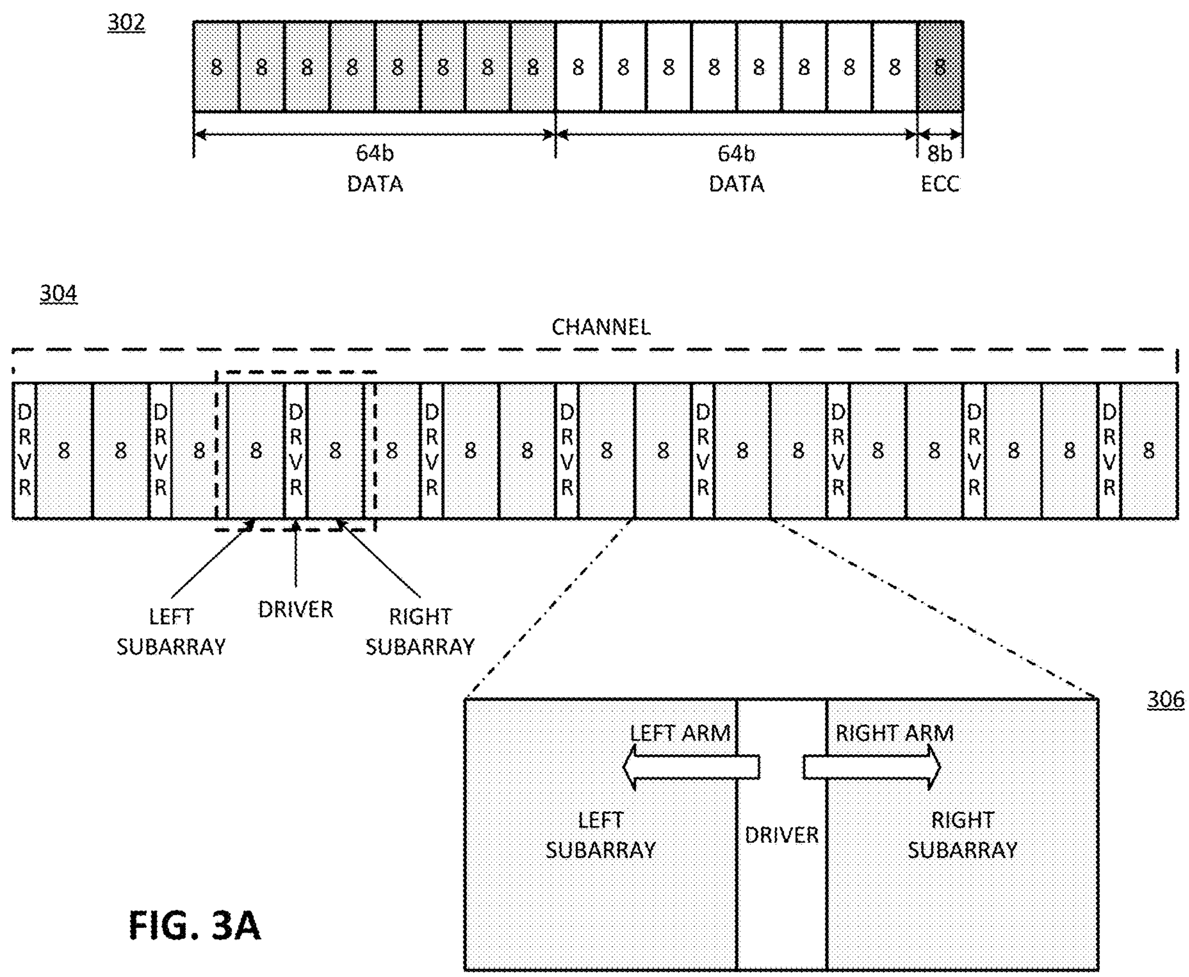
FIG. 3A is a block diagram of an example of a memory architecture in which selective bypass of memory device ECC can be implemented.

FIG. 3A is a block diagram of an example of a memory architecture in which selective bypass of memory device ECC can be implemented. Memory segment 302 represents a portion of a memory array to provide data for a data channel to which a memory device is connected. Segment 302 illustrates two portions of 64 b of data with 8 b of ECC data. Diagram 304 illustrates the architecture of segment 302 with drivers.

Diagram 304 can include a subwordline (SWL) driver that drives 8 bits of data to each side. As illustrated, the dashed box shows 16 bits of data driven by the driver (DRVR) in the middle of the bits. The bits to the left of the driver can be considered a left subarray or a left arm of the driver. Similarly, the bits to the right of the driver can considered a right subarray or a right arm of the driver.

Diagram 306 illustrates an expanded view of one driver and its associated subarrays. The left subarray as the left arm and the right subarray as the right arm are specifically labeled in diagram 306. It will be understood that right and left are relative terms, and refer only to a diagrammatic orientation. In an actual implementation, the bits considered left or right could be switched. Thus, the description of left and right arms refers only to the fact that a driver between a group of bits or memory cells or memory locations drives bits to either physical side of the driver circuitry side to reduce the length of the signal lines needed to be driven between the driver circuitry and the memory cells or bitcells of the memory array.

There will be bits driven out each direction from the active components of the driver. It will be understood that as illustrated, a failure of one arm (SWL arm) results in an 8 b failure because one arm fails and thus one subarray becomes inaccessible. A failure of the driver (SWL driver failure) results in a 16 b failure seeing that both arms become inaccessible.

As described herein, failure of one arm or of a driver can result in a multibit error that could be aliased into an additional bit error. The data from each portion can be selectively fed into ECC hardware, either hard-coded circuitry to implement the code matrix, or into a controller that has software/firmware to implement operations to implement the code matrix. The application of ECC can be selectively bypassed by disabling ECC in response to a retry command.

Figure 3B:
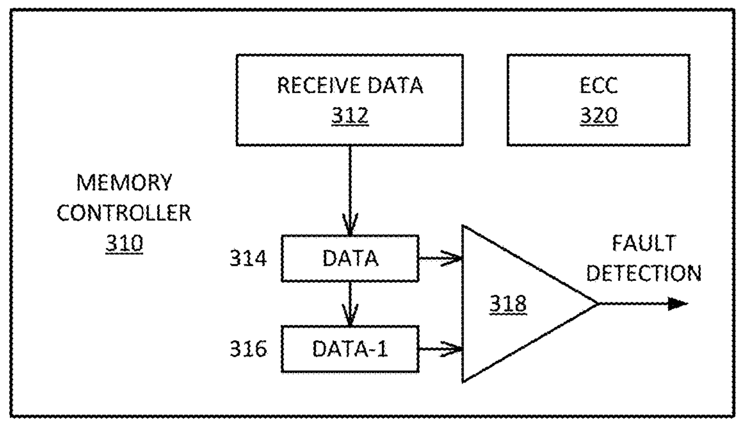
FIG. 3B is a block diagram of an example of a memory controller that receives uncorrected read data.

FIG. 3B is a block diagram of an example of a memory controller that receives uncorrected read data. Memory controller 310 illustrates an example of a memory controller in accordance with memory controller 120 of system 100 or memory controller 220 of system 200. Memory controller 310 performs a check on data as received from segment 302, which can be a segment of a memory array.

In one example, memory controller 310 includes circuitry to receive read data, as illustrated by receive data 312. In one example, memory controller 310 includes register 314 to store the receive data from I/O hardware and register 316 to store a prior version of the data received in response to a read command where internal ECC was enabled at the memory device. In one example, memory controller 310 compares the data of register 314, representing data received in response to a retry command, with data of register 316, representing data received in response to a regular read command where an error was detected. Thus, memory controller 310 issued a retry command and received raw data (register 314) to compare against the corrected data (register 316).

Comparator 318 can be a bit-by-bit comparison to generate a fault detection output that can indicate differences in bits of the data as corrected versus the uncorrected data. In one example, memory controller 310 applies the fault detection output to detect an error in data to perform error correction. Such fault detection can identify the source of the error.

In addition to SBEs that can be corrected with internal ECC at the memory device0,0 other common failure modes include failure of a subwordline (SWL) driver, either the entire driver or one branch of the driver. The SWL driver can have an architecture to drive 8 bits on one arm and 8 bits on another arm or branch. Failure of one arm or branch can result in an 8-bit failure, while failure of the driver can result in a 16-bit failure. In either scenario, the 8 bits of data on the arm can result in an alias error. If memory controller 310 is trying to cover 16 b faults, aliased data may show up with one additional bit that has been miss-corrected, resulting in an uncorrectable error from an otherwise correctable error.

In one example, memory controller sends a retry command with encoding for a Read CAS (column address strobe) to indicate that the memory is to provide raw data or data without the application of internal ECC. In one example, memory controller 310 places the memory in a retry command mode through configuration to receive uncorrected data or raw read data. In one example, memory controller 310 issues back to back read commands to the same address to trigger a retry command, which would not require a separate mode nor different command encoding. In such an example, the memory (such as is described with reference to FIG. 2) can decode the sequence of commands as a retry command.

In response to a retry command, the memory returns raw data, or data without the application of single bit correction in the memory, which allows memory controller 310 to receive the data without alias errors. As such, the retry data from memory will have errors contained within, for example, an 8 b, 16 b, or 32 b boundary as predefined by RAS controller correction capability. The retry data will also have single bit errors from memory devices that would have corrected the SBEs.

In response to the retry data, in one example, memory controller 120 compares the original data of to the retry data. If any retry data has a single bit mis-comparison, in one example, memory controller 310 flips the single bits. Thus, the application of the comparison of data can indicate aliased errors and enable memory controller 310 to correct the alias errors.

Figure 4A:
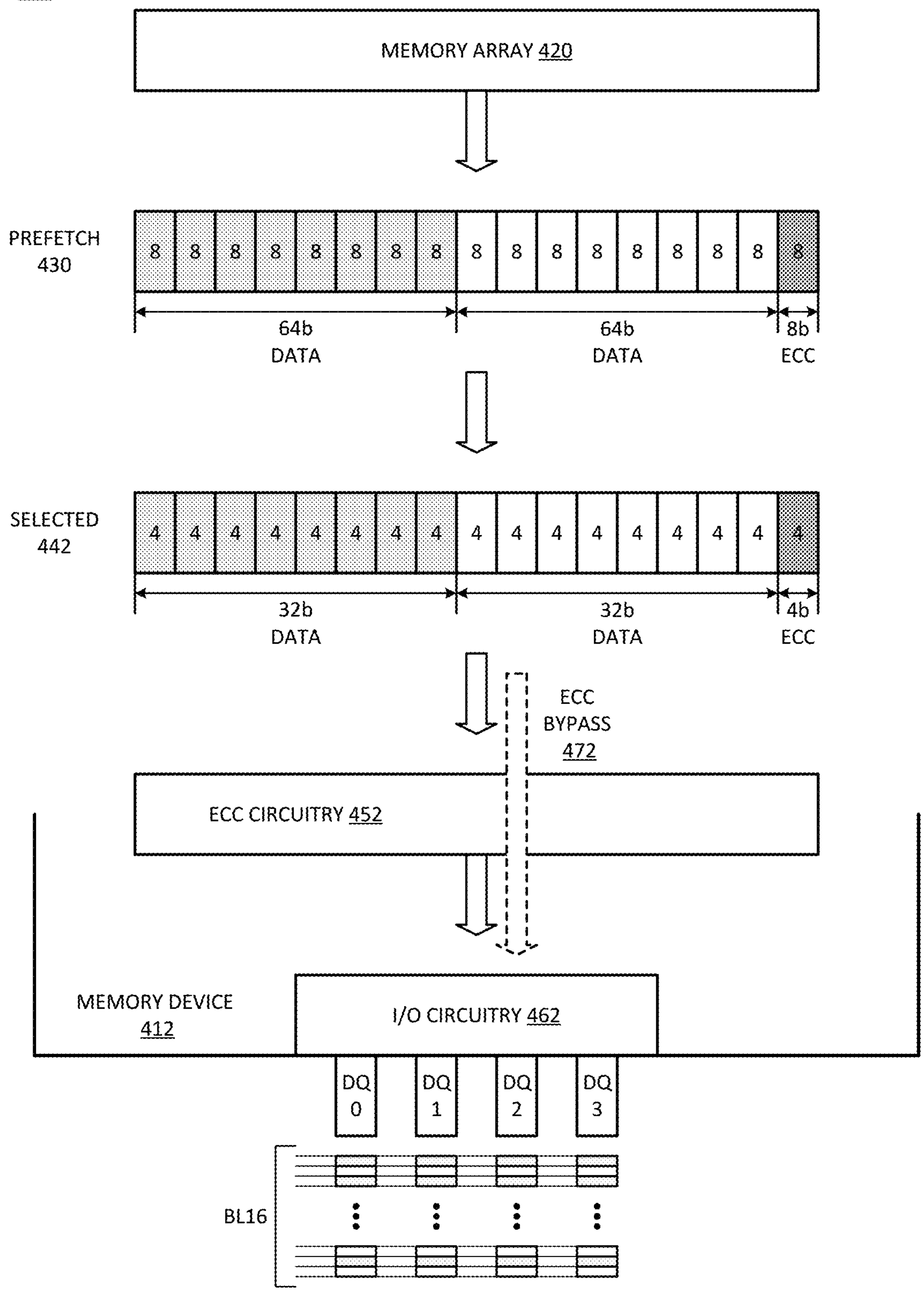
FIG. 4A is a block diagram of an example of a 64-bit data architecture for a memory architecture that allows for selective memory device ECC bypass.

FIG. 4A is a block diagram of an example of a 64-bit data architecture for a memory architecture that allows for selective memory device ECC bypass. Diagram 402 represents elements that can be incorporated in a system such as system 100 or system 200. Diagram 402 represents a core memory architecture for a 64-bit data architecture, such as a DDR4 implementation. As illustrated, the memory core performs a 128 b internal prefetch, and includes 8 b ECC for internal ECC. Diagram 402 specifically illustrates a ×4 architecture, whereas a ×8 implementation could use all 128 bits of prefetch data.

In a ×4 implementation as illustrated, 64 bits can be exchanged with the host or the associated memory controller for each memory access transaction, based on 4 signal lines with a burst length of 16 (BL16), since 4*16=64. If the lightly shaded block of diagram 402 represent the upper half, the non-shaded blocks represent the lower half, and vice versa. The darkly shaded bits represent the ECC bits. As illustrated, the 64 b of data can be fetched from the lower half, or from the upper half, or can be split between the upper and lower halves. A split of the halves implies use of only 4 b of each 8 b from a subarray.

Diagram 402 illustrates the application of memory device 412 with I/O circuitry 462 to interface with 4 DQ (data) signal lines, DQ[3:0]. Memory device 412 includes memory array 420, showed in prefetch 430 to be separated into different subarrays. It will be understood that when not all prefetched data is used, all the prefetched data can be placed in the sense amplifier, and then only selected data will be used for the memory access, as illustrated by selected 442. Thus, prefetch 430 can represent data in the sense amplifier, and selected 442 represents data from the sense amplifier that is sent to the I/O for a read operation.

For example, data can be placed into the sense amp and then addressing operates to select specific portions of the data to be written for a write operation or read out for a read operation. The addressing can select the data in any manner that makes sense for the architecture. In one example, a portion of the prefetched data is selected for the access operation. As illustrated, 4 bits of 8 bits are selected from each subarray.

In one example, the selected bits for a read operation, selected 442, can be provided to ECC circuitry 452, which represents on-device or internal ECC logic for memory device 412. In one example, ECC circuitry 452 can be thought of or referred to as an ECC engine. ECC circuitry 452 can apply ECC to the read data to correct errors prior to providing the data to I/O circuitry 462 to be output to the host (not specifically shown).

In one example, memory device 412 includes ECC bypass 472, which represents a mechanism to provide raw read data to the host without the application of internal ECC. In one example, ECC circuitry 452 includes a multiplexer (mux) or other hardware to selectively bypass the operation of the ECC circuitry. In one example, ECC circuitry 452 performs its operation each time, and there is an alternate data path to provide the data without application of ECC, which can then be multiplexed or selected at I/O circuitry 462.

In response to a retry command, memory device 412 can be considered to disable ECC by bypassing ECC circuitry 452 by either disabling the ECC circuitry, routing raw data around the ECC circuitry, or providing another path to selectively output the raw data. Thus, memory device 412 can apply ECC in response to a normal read command, and bypass the application of ECC in response to a retry command.

Figure 4B:
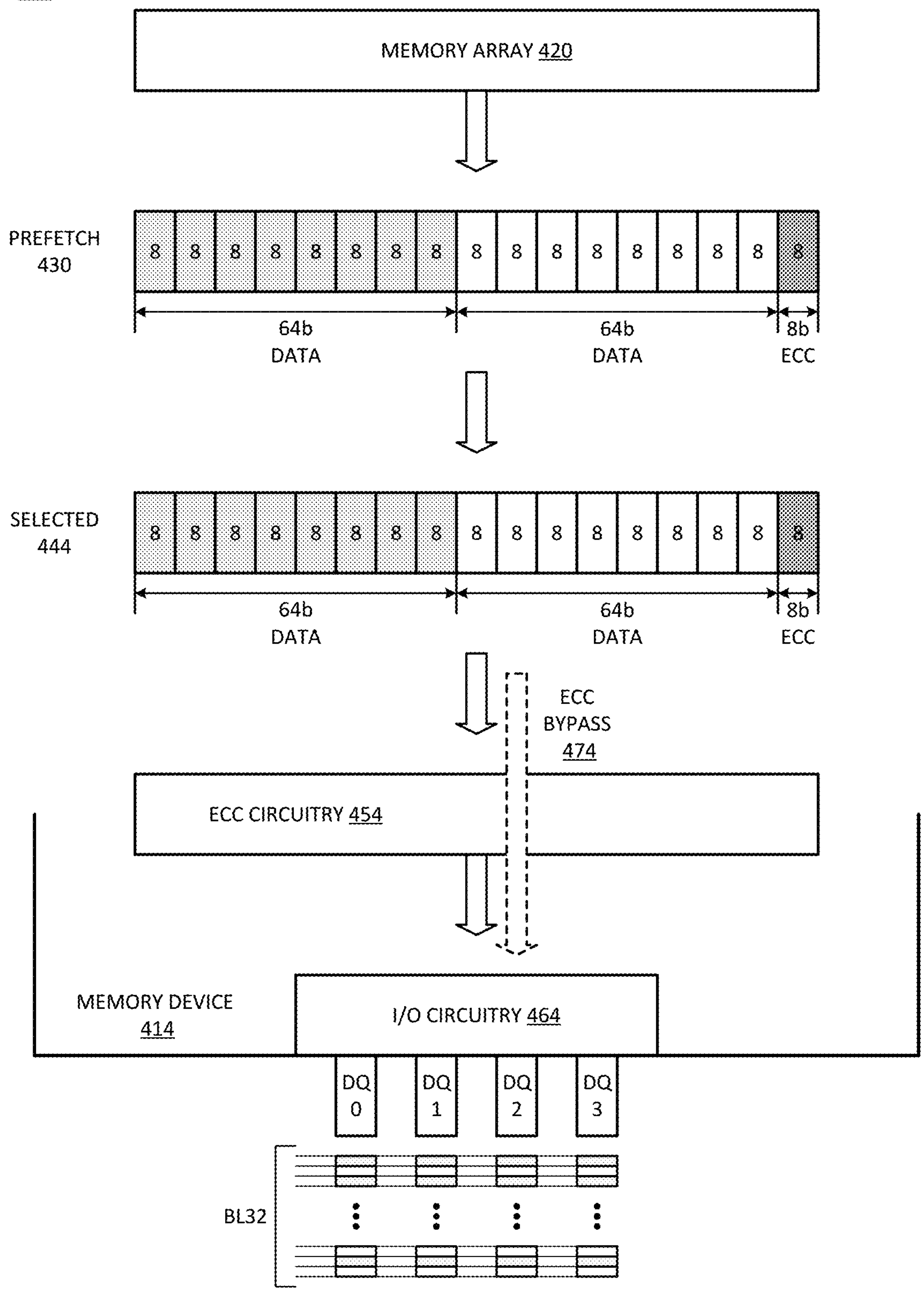
FIG. 4B is a block diagram of an example of a 128-bit data architecture for a memory architecture that allows for selective memory device ECC bypass.

FIG. 4B is a block diagram of an example of a 128-bit data architecture for a memory architecture that allows for selective memory device ECC bypass. Diagram 404 represents elements that can be incorporated in a system such as system 100 or system 200. Diagram 404 represents a core memory architecture, such as a DDR5 implementation. As illustrated, the memory core performs a 128 b internal prefetch, and includes 8 b ECC for internal ECC. In a ×4 implementation, 128 bits can be exchanged with the host or the associated memory controller for each memory access transaction, based on 4 signal lines with a burst length of 32 (BL32), since 4*32=128. Thus, as illustrated, both the upper half of the array and the lower half of the array provide 64 b of data each. The upper half can be based on the architecture of the memory and the addressing structure, which is not specifically shown in diagram 404. If the lightly shaded block of diagram 404 represent the upper half, the non-shaded blocks represent the lower half, and vice versa. The darkly shaded bits represent the ECC bits.

Diagram 404 illustrates the application of memory device 414 with I/O circuitry 464 to interface with 4 DQ (data) signal lines, DQ[3:0]. Memory device 414 includes memory array 420, showed in prefetch 430 to be separated into different subarrays. Selected 444 represents data from the sense amplifier that is sent to the I/O for a read operation, and can include all 128 prefetched bits.

In one example, the selected bits for a read operation, selected 444, can be provided to ECC circuitry 454, which represents on-device or internal ECC logic for memory device 414. In one example, ECC circuitry 454 can be thought of or referred to as an ECC engine. ECC circuitry 454 can apply ECC to the read data to correct errors prior to providing the data to I/O circuitry 464 to be output to the host (not specifically shown).

In one example, memory device 414 includes ECC bypass 474, which represents a mechanism to provide raw read data to the host without the application of internal ECC. In one example, ECC circuitry 454 includes a multiplexer (mux) or other hardware to selectively bypass the operation of the ECC circuitry. In one example, ECC circuitry 454 performs its operation each time, and there is an alternate data path to provide the data without application of ECC, which can then be multiplexed or selected at I/O circuitry 464.

In response to a retry command, memory device 414 can be considered to disable ECC by bypassing ECC circuitry 454 by either disabling the ECC circuitry, routing raw data around the ECC circuitry, or providing another path to selectively output the raw data. Thus, memory device 414 can apply ECC in response to a normal read command, and bypass the application of ECC in response to a retry command.

Figure 5:
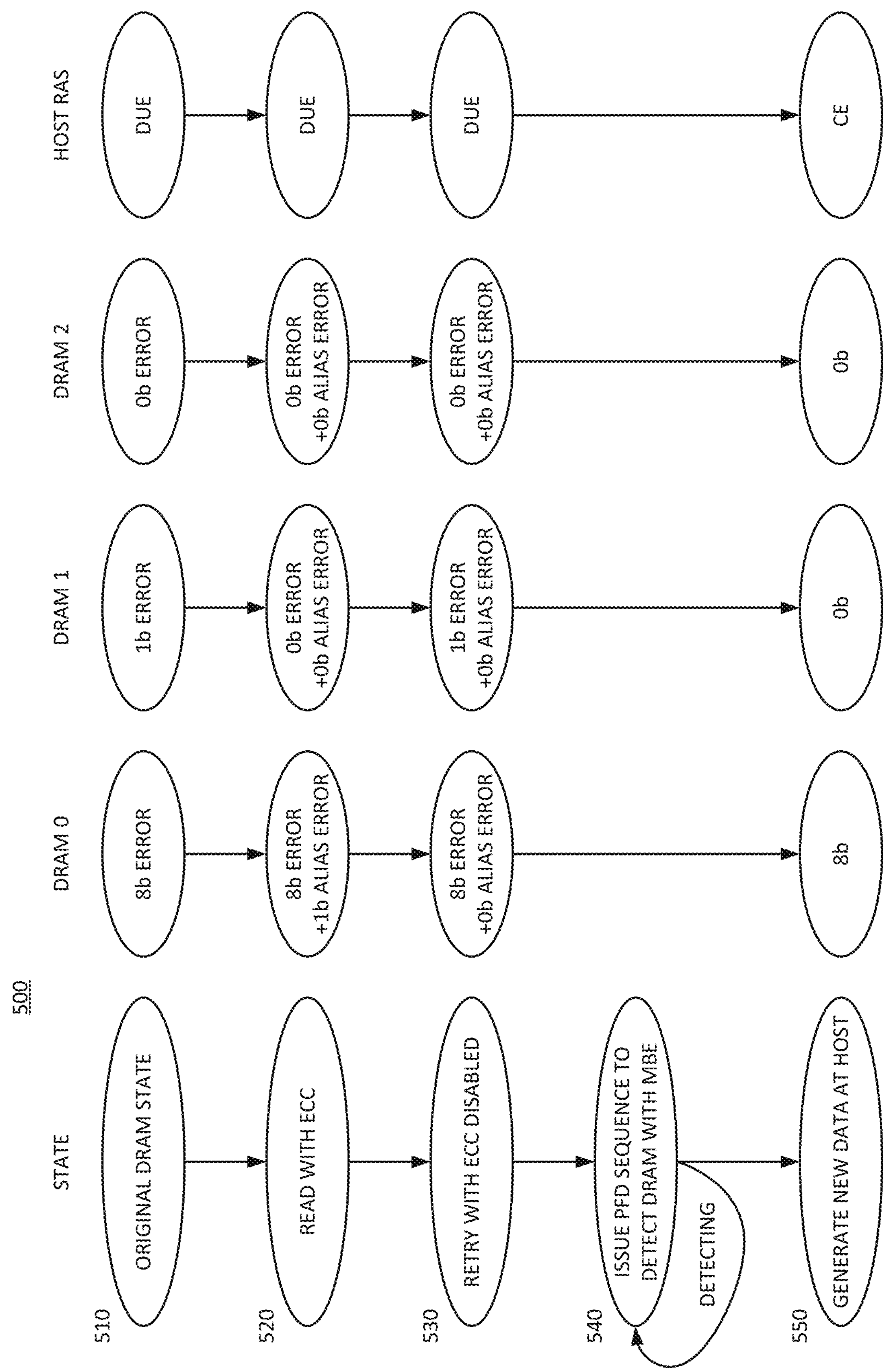
FIG. 5 is a representation of an example of a state diagram for a memory subsystem with selective memory device ECC bypass.

FIG. 5 is a representation of an example of a state diagram for a memory subsystem with selective memory device ECC bypass. Diagram 500 illustrates the states of a retry sequence for a retry command in accordance with any example herein. The left-most column illustrates the various states, and the other columns illustrate the states for DRAM 0, DRAM 1, DRAM 2, and the host RAS, respectively.

State 510 represents an original DRAM state. State 520 represents a state in which the DRAMs read data with ECC enabled. State 530 represents a state in which the DRAMs read data with ECC disabled. State 540 represents the operation by the host to perform fault detection. In one example, the host issues a PFD (permanent fault detection) sequence to detect a DRAM with an MBE. The host can perform operations iteratively to perform the detecting until the faults are detected. State 550 represents a state in which the host generates new data at the host with respect to the various DRAMs.

For state 510, consider an example where DRAM 0 has an 8-bit error, DRAM 1 has a 1-bit error, and DRAM 2 has no errors. If the data from the DRAMs is presented to the host with SDDC code protection at the host, the result would be a DUE because an SDDC code is limited in this example to 8 b correction.

At state 520, the DRAM devices apply ECC on the reads. Thus, DRAM 0 would have an aliasing issue as it would mis-correct the 8-bit error by flipping another bit. Thus, the 8-bit error becomes an 8-bit error with a +1 bit alias error. On-die ECC fixes the error on DRAM 1, and there is no data change on DRAM 2. Thus, both DRAM 1 and DRAM 2 have 0 errors with 0 alias errors. However, due to the 8-bit error of DRAM 0, the host will detect a DUE.

In response to detection of the DUE by the host, in one example, the host transitions to state 530 to retry the read with ECC disabled at the DRAMs. In response to the retry command of state 530, DRAM 0 returns the 8-bit error with no alias error. DRAM 1 returns the 1 b error, and DRAM 2 returns the data without error. It will be understood that with the uncorrected data, there are errors to result in a DUE at the host.

In one example, at state 540, the host performs PFD operations to detect MBEs. In one example, the host issues a fixed write pattern (e.g. AAAAh) command followed by a PREcharge command to close the page. Closing the page ensures the data is moved from the sense amps to the DRAM cells. In one example, the host then issues a read command to the same address and then compares the data to write pattern. Such operation can isolate multiple bit errors to DRAM 0 as it will return with multiple errors.

At state 550, the host can identify the 8 b error of DRAM 0 and eliminate the alias error. Thus, the host can use the corrected data for DRAM 1 and DRAM 2 to result in no errors for that data, and only the 8 b error for DRAM 0. The RAS result at the host is a correctable error (CE) instead of a DUE.

Figure 6:
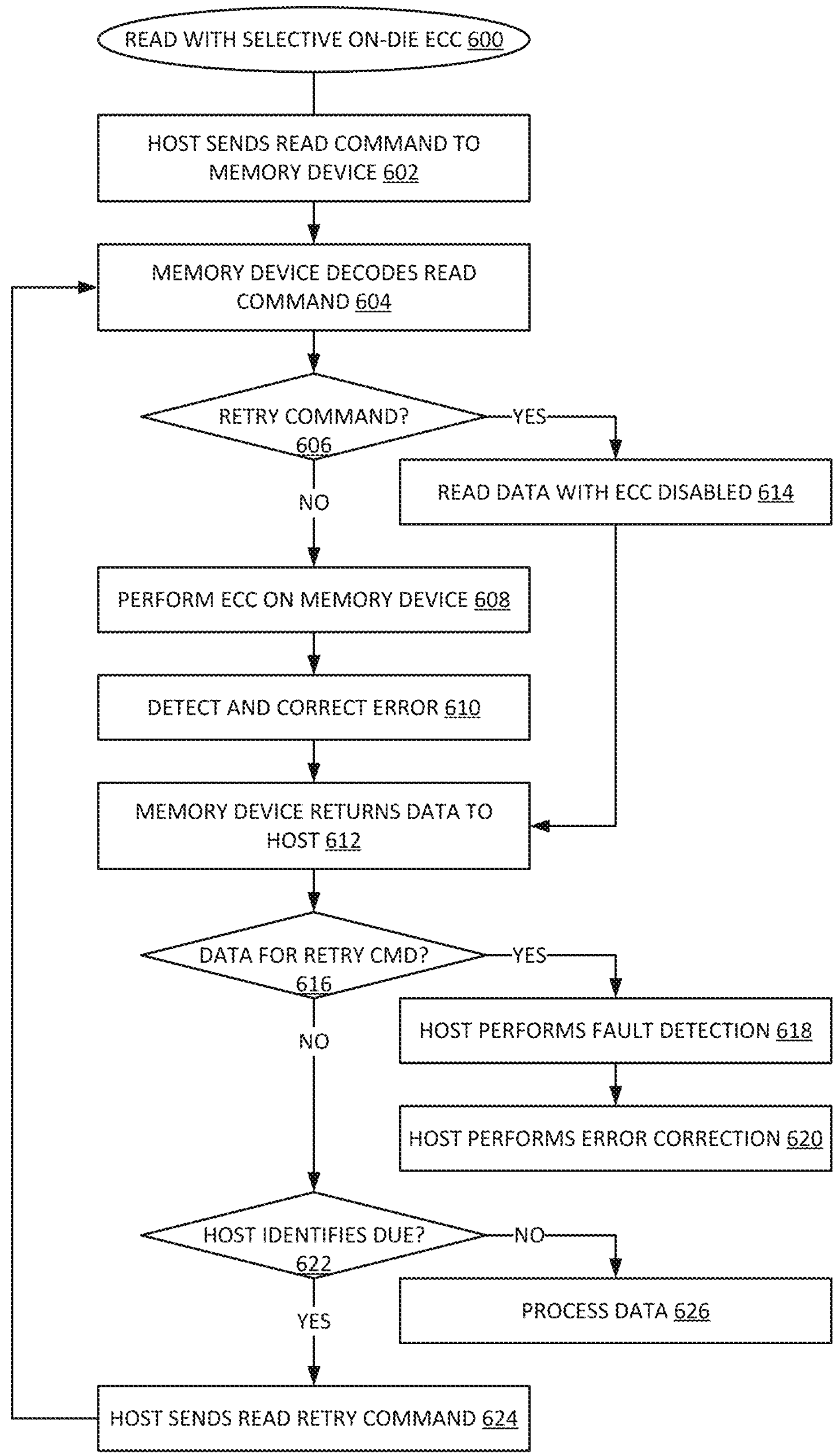
FIG. 6 is a flow diagram of an example of a process for selectively bypassing on-die ECC.

FIG. 6 is a flow diagram of an example of a process for selectively bypassing on-die ECC. Process 600 represents a process for selectively applying on-die ECC for a read operation. Process 600 can be performed by a system in accordance with system 100 or system 200. In one example, the host sends a read command to the memory device, at 602. In one example, the retry command can be used without first sending a read command that uses ECC. In response to the read command, the memory device decodes the read command, at 604.

In one example, the memory device determines whether the read command is a normal read command or a retry command. If the read command is a normal read command, at 606 NO branch, the memory device would typically perform ECC internally, at 608. The performance of the ECC can include detection and correction of errors, at 610. The memory device then returns the corrected data to the host, at 612. As described above, such an operation could result in an alias error.

After the memory device returns the data on which internal ECC has been applied, the host determines if the data received is for a retry command or a normal command. If the data is not for a retry command, at 616, NO branch, the host can determine if the data results in a DUE. If the data does not include a DUE error, at 622 NO branch, the host processes the data, at 626.

In one example, if the host identifies a DUE, at 622 YES branch, the host sends a read retry command to the memory, at 624. In one example, the retry command is received at the memory device, and the memory device decodes the read command, at 604. In response to a retry command, the memory device decodes the read command as a retry command, at 606 YES branch. In response to the retry command, the memory device reads data with ECC disabled, at 614. When reading with ECC disabled, the memory device returns raw data to the host, at 612.

If the data received at the host is for a retry command, at 616 YES branch, in one example, the host performs fault detection, 618. The fault detection enables the host to determine where an alias error may be within the memory data. In one example, the host performs error correction based on information gathered from a comparison of raw data and memory-corrected data, at 620.

Figure 7:
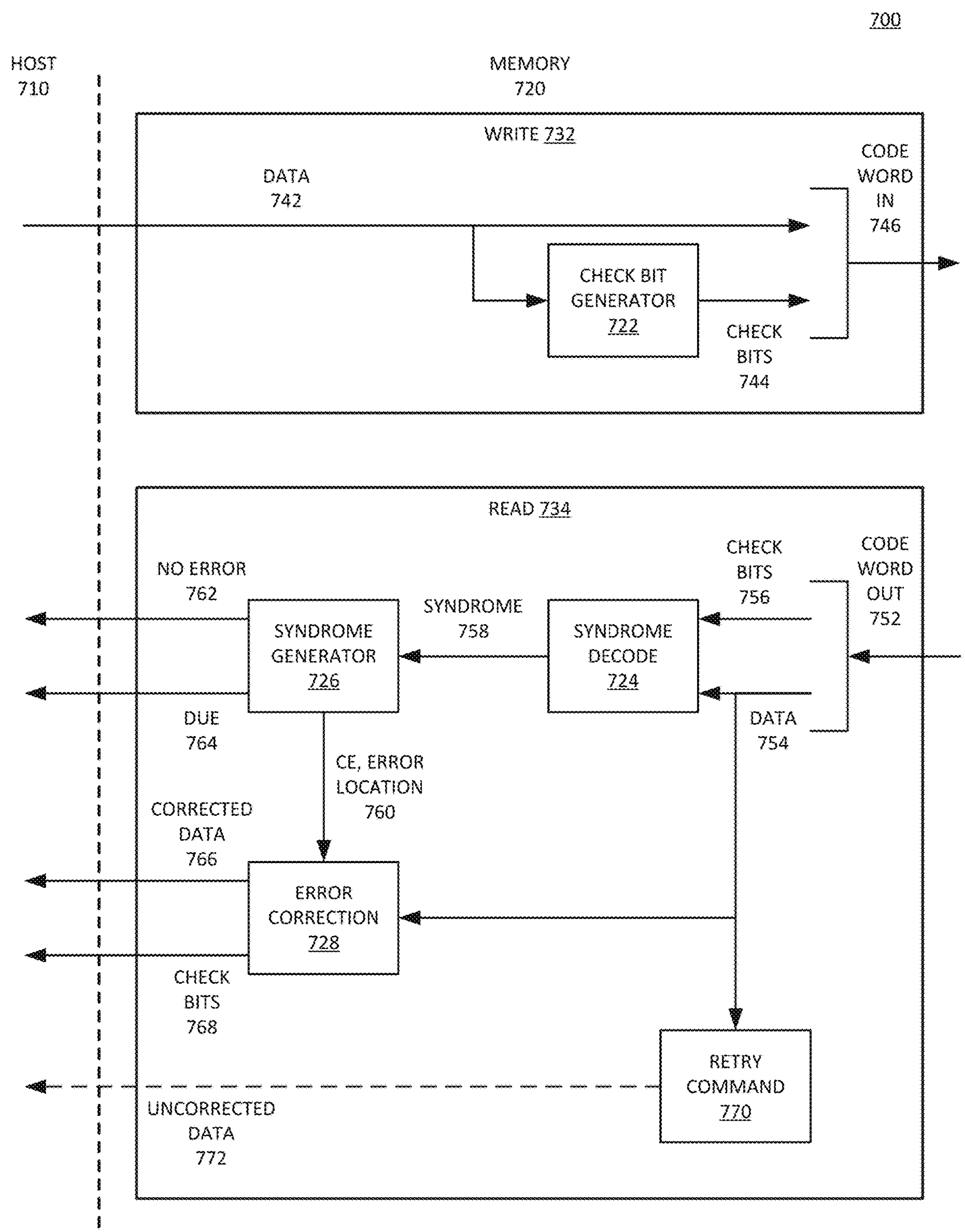
FIG. 7 is a block diagram of an example of an on-die error checking and correction (ECC) subsystem to implement selective on-die ECC bypass.

FIG. 7 is a block diagram of an example of an on-device ECC engine to implement selective on-die ECC bypass. System 700 provides an example of on-die ECC circuitry for a system in accordance with system 100 or system 200. Host 710 includes a memory controller or equivalent or alternative circuit or component that manages access to memory 720. Host 710 performs external ECC on data read from memory 720. Memory 720 implements on-die ECC to check and correct data prior to sending the data to host 710.

System 700 illustrates write path 732 in memory 720, which represents a path for data written from host 710 to memory 720. Host 710 provides data 742 to memory 720 for writing to the memory array(s). In one example, memory 720 generates check bits 744 with check bit generator 722 to store with the data in memory. Check bits 744 can be referred to as ECC bits, and enable memory 720 to correct an error that might occur in the writing to and reading from the memory array(s). Data 742 and check bits 744 can be included as code word in 746, which is written to the memory resources.

Read path 734 represents a path for data read from memory 720 to host 710. In one example, at least certain hardware components of write path 732 and read path 734 are the same hardware. In one example, memory 720 fetches code word out 752 in response to a Read command from host 710. The code word can include data 754 and check bits 756. Data 754 and check bits 756 can correspond, respectively, to data 742 and check bits 744 written in write path 732. Thus, a read can access data and ECC bits.

It will be understood that error correction in read path 734 can include the application of an XOR (exclusive OR) tree to a corresponding H matrix to detect errors and selectively correct errors (in the case of a single bit error). The structure of the XOR tree can be designed to implement the H matrix. As is understood in the art, an H matrix refers to a hamming code parity-check matrix that shows how linear combinations of digits of the codeword equal zero. Thus, the H matrix rows identify the coefficients of parity check equations that must be satisfied for a component or digit to be part of a codeword. In one example, memory 720 includes syndrome decode 724, which enables the memory to apply check bits 756 to data 754 to detect errors in the read data. Syndrome decode 724 can generate syndrome 758 for use in generating appropriate error information for the read data. Data 754 can also be forwarded to error correction 728 for correction of a detected error.

In one example, syndrome decode 724 passes syndrome 758 to syndrome generator 726 to generate an error vector. In one example, check bit generator 722 and syndrome generator 726 are fully specified by a corresponding H matrix for the memory device. In one example, if there are no errors in the read data (e.g., zero syndrome 758), syndrome generator 726 generates a no error signal 762. In one example, if there are multiple errors in the read data (e.g., non-zero syndrome 758 that does not match any of the columns in a corresponding H matrix), syndrome generator 726 generates a DUE (detected uncorrected error) signal 764, which indicates a detected, uncorrected error. DUE signal 764 can indicate a multibit error that memory 720 was not able to correct by internal ECC.

In one example, if there is a single bit error (e.g., non-zero syndrome 758 that matches one of the columns of a corresponding H matrix), syndrome generator 726 can generate a CE (corrected error) signal with error location 760, which is a corrected error indication to error correction logic 728. Error correction 728 can apply the corrected error to the specified location in data 754 to generate corrected data 766 for output to host 710. In one example, error correction 728 also generates check bits 768, which includes the check bits for the read data.

Check bits 768 can be considered an error vector that indicates a state of errors in the read data transmitted to host 710. It will be understood that zero syndrome (no error 762) condition and a corrected SBE resulting in corrected data 766 will have the same check bits 768, indicating no error to host 710. Thus, check bits 768 will not provide information about SBE in memory 720, but only multibit errors. In one example, system 700 writes corrected data back to the memory array.

In one example, read path 734 includes retry command 770, which represents logic for system 700 to respond to a retry command. In one example, in response to a retry command, memory 720 forwards data 754 as uncorrected data 772. The pathway from retry command 770 to output uncorrected data 772 can be considered an ECC bypass path, where the ECC circuitry is not applied for read path 734. Retry command 770 can have an input to indicate that the read command received is a retry command. Thus, the other pathway will not be used to output data to host 710, but the retry path will provide raw data, or data 754 as retrieved from the memory array without application of internal ECC.

Figure 8:
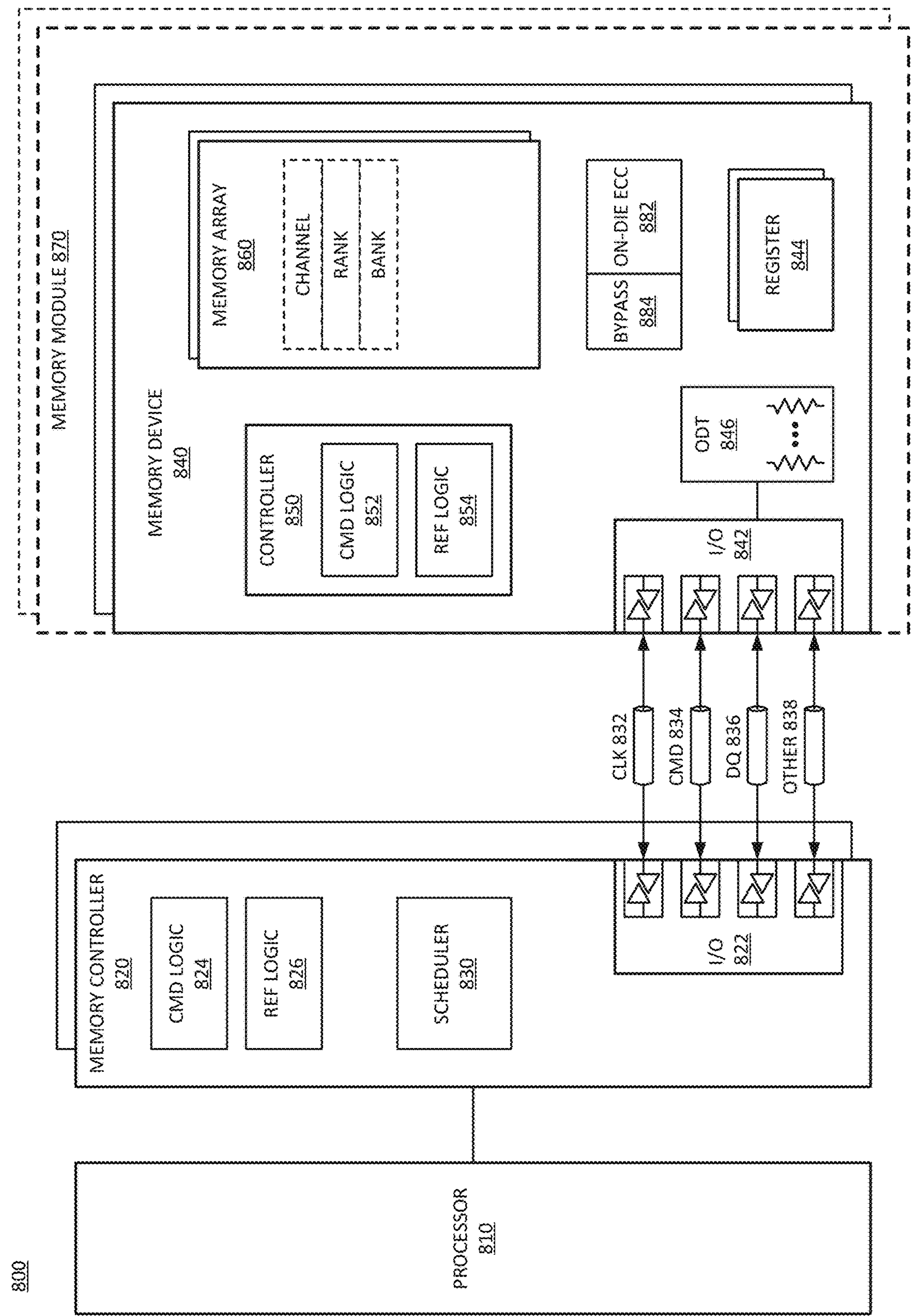
FIG. 8 is a block diagram of an example of a memory subsystem in which selective on-die ECC bypass can be implemented.

FIG. 8 is a block diagram of an example of a memory subsystem in which selective on-die ECC bypass can be implemented. System 800 includes a processor and elements of a memory subsystem in a computing device. System 800 is one example of a system that can incorporate a system compatible with system 100 or system 200.

In one example, memory 840 includes on-die ECC 882 to perform ECC on read data prior to returning the data to memory controller 820. In one example, memory 840 includes bypass 884 to selectively bypass on-die ECC 882. The bypassing of internal ECC can be in accordance with any description herein, where memory 840 performs a read in response to a retry command. Based on the retry command, memory 840 returns raw data from memory array 860 instead of performing ECC on the data prior to returning the data.

Processor 810 represents a processing unit of a computing platform that may execute an operating system (OS) and applications, which can collectively be referred to as the host or the user of the memory. The OS and applications execute operations that result in memory accesses. Processor 810 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 800 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (double data rate (DDR) version 4, JESD79-4, originally published in September 2012 by JEDEC (Joint Electron Device Engineering Council)), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, currently in discussion by JEDEC), LPDDR5 (LPDDR version 5, JESD209-5, originally published by JEDEC in February 2019), HBM2 ((HBM version 2), currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND (not AND) or NOR (not OR) technologies. Thus, a memory device can also include a future generation nonvolatile devices, such as a three dimensional crosspoint memory device, other byte addressable nonvolatile memory devices. A memory device can include a nonvolatile, byte addressable media that stores data based on a resistive state of the memory cell, or a phase of the memory cell. In one example, the memory device can use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Memory controller 820 represents one or more memory controller circuits or devices for system 800. Memory controller 820 represents control logic that generates memory access commands in response to the execution of operations by processor 810. Memory controller 820 accesses one or more memory devices 840. Memory devices 840 can be DRAM devices in accordance with any referred to above. In one example, memory devices 840 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 820 manages a separate memory channel, although system 800 can be configured to have multiple channels managed by a single controller, or to have multiple controllers on a single channel. In one example, memory controller 820 is part of host processor 810, such as logic implemented on the same die or implemented in the same package space as the processor.

Memory controller 820 includes I/O interface logic 822 to couple to a memory bus, such as a memory channel as referred to above. I/O interface logic 822 (as well as I/O interface logic 842 of memory device 840) can include pins, pads, connectors, signal lines, traces, or wires, or other hardware to connect the devices, or a combination of these. I/O interface logic 822 can include a hardware interface. As illustrated, I/O interface logic 822 includes at least drivers/transceivers for signal lines. Commonly, wires within an integrated circuit interface couple with a pad, pin, or connector to interface signal lines or traces or other wires between devices. I/O interface logic 822 can include drivers, receivers, transceivers, or termination, or other circuitry or combinations of circuitry to exchange signals on the signal lines between the devices. The exchange of signals includes at least one of transmit or receive. While shown as coupling I/O 822 from memory controller 820 to I/O 842 of memory device 840, it will be understood that in an implementation of system 800 where groups of memory devices 840 are accessed in parallel, multiple memory devices can include I/O interfaces to the same interface of memory controller 820. In an implementation of system 800 including one or more memory modules 870, I/O 842 can include interface hardware of the memory module in addition to interface hardware on the memory device itself. Other memory controllers 820 will include separate interfaces to other memory devices 840.

The bus between memory controller 820 and memory devices 840 can be implemented as multiple signal lines coupling memory controller 820 to memory devices 840. The bus may typically include at least clock (CLK) 832, command/address (CMD) 834, and write data (DQ) and read data (DQ) 836, and zero or more other signal lines 838. In one example, a bus or connection between memory controller 820 and memory can be referred to as a memory bus. In one example, the memory bus is a multi-drop bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 800 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 820 and memory devices 840. An example of a serial bus technology is 86106 encoding and transmission of high-speed data with embedded clock over a single differential pair of signals in each direction. In one example, CMD 834 represents signal lines shared in parallel with multiple memory devices. In one example, multiple memory devices share encoding command signal lines of CMD 834, and each has a separate chip select (CS_n) signal line to select individual memory devices.

It will be understood that in the example of system 800, the bus between memory controller 820 and memory devices 840 includes a subsidiary command bus CMD 834 and a subsidiary bus to carry the write and read data, DQ 836. In one example, the data bus can include bidirectional lines for read data and for write/command data. In another example, the subsidiary bus DQ 836 can include unidirectional write signal lines for write and data from the host to memory, and can include unidirectional lines for read data from the memory to the host. In accordance with the chosen memory technology and system design, other signals 838 may accompany a bus or sub bus, such as strobe lines DQS. Based on design of system 800, or implementation if a design supports multiple implementations, the data bus can have more or less bandwidth per memory device 840. For example, the data bus can support memory devices that have either a ×4 interface, a ×8 interface, a ×16 interface, or other interface. The convention "xW," where W is an integer that refers to an interface size or width of the interface of memory device 840, which represents a number of signal lines to exchange data with memory controller 820. The interface size of the memory devices is a controlling factor on how many memory devices can be used concurrently per channel in system 800 or coupled in parallel to the same signal lines. In one example, high bandwidth memory devices, wide interface devices, or stacked memory configurations, or combinations, can enable wider interfaces, such as a ×128 interface, a ×256 interface, a ×512 interface, a ×1024 interface, or other data bus interface width.

In one example, memory devices 840 and memory controller 820 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length eight (BL8), and each memory device 840 can transfer data on each UI. Thus, a ×8 memory device operating on BL8 can transfer 84 bits of data (8 data signal lines times 8 data bits transferred per line over the burst). It will be understood that this simple example is merely an illustration and is not limiting.

Memory devices 840 represent memory resources for system 800. In one example, each memory device 840 is a separate memory die. In one example, each memory device 840 can interface with multiple (e.g., 2) channels per device or die. Each memory device 840 includes I/O interface logic 842, which has a bandwidth determined by the implementation of the device (e.g., ×16 or ×8 or some other interface bandwidth). I/O interface logic 842 enables the memory devices to interface with memory controller 820. I/O interface logic 842 can include a hardware interface, and can be in accordance with I/O 822 of memory controller, but at the memory device end. In one example, multiple memory devices 840 are connected in parallel to the same command and data buses. In another example, multiple memory devices 840 are connected in parallel to the same command bus, and are connected to different data buses. For example, system 800 can be configured with multiple memory devices 840 coupled in parallel, with each memory device responding to a command, and accessing memory resources 860 internal to each. For a Write operation, an individual memory device 840 can write a portion of the overall data word, and for a Read operation, an individual memory device 840 can fetch a portion of the overall data word. The remaining bits of the word will be provided or received by other memory devices in parallel.

In one example, memory devices 840 are disposed directly on a motherboard or host system platform (e.g., a PCB (printed circuit board) on which processor 810 is disposed) of a computing device. In one example, memory devices 840 can be organized into memory modules 870. In one example, memory modules 870 represent dual inline memory modules (DIMMs). In one example, memory modules 870 represent other organization of multiple memory devices to share at least a portion of access or control circuitry, which can be a separate circuit, a separate device, or a separate board from the host system platform. Memory modules 870 can include multiple memory devices 840, and the memory modules can include support for multiple separate channels to the included memory devices disposed on them. In another example, memory devices 840 may be incorporated into the same package as memory controller 820, such as by techniques such as multi-chip-module (MCM), package-on-package, through-silicon via (TSV), or other techniques or combinations. Similarly, in one example, multiple memory devices 840 may be incorporated into memory modules 870, which themselves may be incorporated into the same package as memory controller 820. It will be appreciated that for these and other implementations, memory controller 820 may be part of host processor 810.

Memory devices 840 each include one or more memory arrays 860. Memory array 860 represents addressable memory locations or storage locations for data. Typically, memory array 860 is managed as rows of data, accessed via wordline (rows) and bitline (individual bits within a row) control. Memory array 860 can be organized as separate channels, ranks, and banks of memory. Channels may refer to independent control paths to storage locations within memory devices 840. Ranks may refer to common locations across multiple memory devices (e.g., same row addresses within different devices) in parallel. Banks may refer to sub-arrays of memory locations within a memory device 840. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 840 include one or more registers 844. Register 844 represents one or more storage devices or storage locations that provide configuration or settings for the operation of the memory device. In one example, register 844 can provide a storage location for memory device 840 to store data for access by memory controller 820 as part of a control or management operation. In one example, register 844 includes one or more Mode Registers. In one example, register 844 includes one or more multipurpose registers. The configuration of locations within register 844 can configure memory device 840 to operate in different "modes," where command information can trigger different operations within memory device 840 based on the mode. Additionally or in the alternative, different modes can also trigger different operation from address information or other signal lines depending on the mode. Settings of register 844 can indicate configuration for I/O settings (e.g., timing, termination or ODT (on-die termination) 846, driver configuration, or other I/O settings).

In one example, memory device 840 includes ODT 846 as part of the interface hardware associated with I/O 842. ODT 846 can be configured as mentioned above, and provide settings for impedance to be applied to the interface to specified signal lines. In one example, ODT 846 is applied to DQ signal lines. In one example, ODT 846 is applied to command signal lines. In one example, ODT 846 is applied to address signal lines. In one example, ODT 846 can be applied to any combination of the preceding. The ODT settings can be changed based on whether a memory device is a selected target of an access operation or a non-target device. ODT 846 settings can affect the timing and reflections of signaling on the terminated lines. Careful control over ODT 846 can enable higher-speed operation with improved matching of applied impedance and loading. ODT 846 can be applied to specific signal lines of I/O interface 842, 822 (for example, ODT for DQ lines or ODT for CA lines), and is not necessarily applied to all signal lines.

Memory device 840 includes controller 850, which represents control logic within the memory device to control internal operations within the memory device. For example, controller 850 decodes commands sent by memory controller 820 and generates internal operations to execute or satisfy the commands. Controller 850 can be referred to as an internal controller, and is separate from memory controller 820 of the host. Controller 850 can determine what mode is selected based on register 844, and configure the internal execution of operations for access to memory resources 860 or other operations based on the selected mode. Controller 850 generates control signals to control the routing of bits within memory device 840 to provide a proper interface for the selected mode and direct a command to the proper memory locations or addresses. Controller 850 includes command logic 852, which can decode command encoding received on command and address signal lines. Thus, command logic 852 can be or include a command decoder. With command logic 852, memory device can identify commands and generate internal operations to execute requested commands.

Referring again to memory controller 820, memory controller 820 includes command (CMD) logic 824, which represents logic or circuitry to generate commands to send to memory devices 840. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 840, memory controller 820 can issue commands via I/O 822 to cause memory device 840 to execute the commands. In one example, controller 850 of memory device 840 receives and decodes command and address information received via I/O 842 from memory controller 820. Based on the received command and address information, controller 850 can control the timing of operations of the logic and circuitry within memory device 840 to execute the commands. Controller 850 is responsible for compliance with standards or specifications within memory device 840, such as timing and signaling requirements. Memory controller 820 can implement compliance with standards or specifications by access scheduling and control.

Memory controller 820 includes scheduler 830, which represents logic or circuitry to generate and order transactions to send to memory device 840. From one perspective, the primary function of memory controller 820 could be said to schedule memory access and other transactions to memory device 840. Such scheduling can include generating the transactions themselves to implement the requests for data by processor 810 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 820 typically includes logic such as scheduler 830 to allow selection and ordering of transactions to improve performance of system 800. Thus, memory controller 820 can select which of the outstanding transactions should be sent to memory device 840 in which order, which is typically achieved with logic much more complex that a simple first-in first-out algorithm. Memory controller 820 manages the transmission of the transactions to memory device 840, and manages the timing associated with the transaction. In one example, transactions have deterministic timing, which can be managed by memory controller 820 and used in determining how to schedule the transactions with scheduler 830.

In one example, memory controller 820 includes refresh (REF) logic 826. Refresh logic 826 can be used for memory resources that are volatile and need to be refreshed to retain a deterministic state. In one example, refresh logic 826 indicates a location for refresh, and a type of refresh to perform. Refresh logic 826 can trigger self-refresh within memory device 840, or execute external refreshes which can be referred to as auto refresh commands) by sending refresh commands, or a combination. In one example, controller 850 within memory device 840 includes refresh logic 854 to apply refresh within memory device 840. In one example, refresh logic 854 generates internal operations to perform refresh in accordance with an external refresh received from memory controller 820. Refresh logic 854 can determine if a refresh is directed to memory device 840, and what memory resources 860 to refresh in response to the command.

Figure 9:
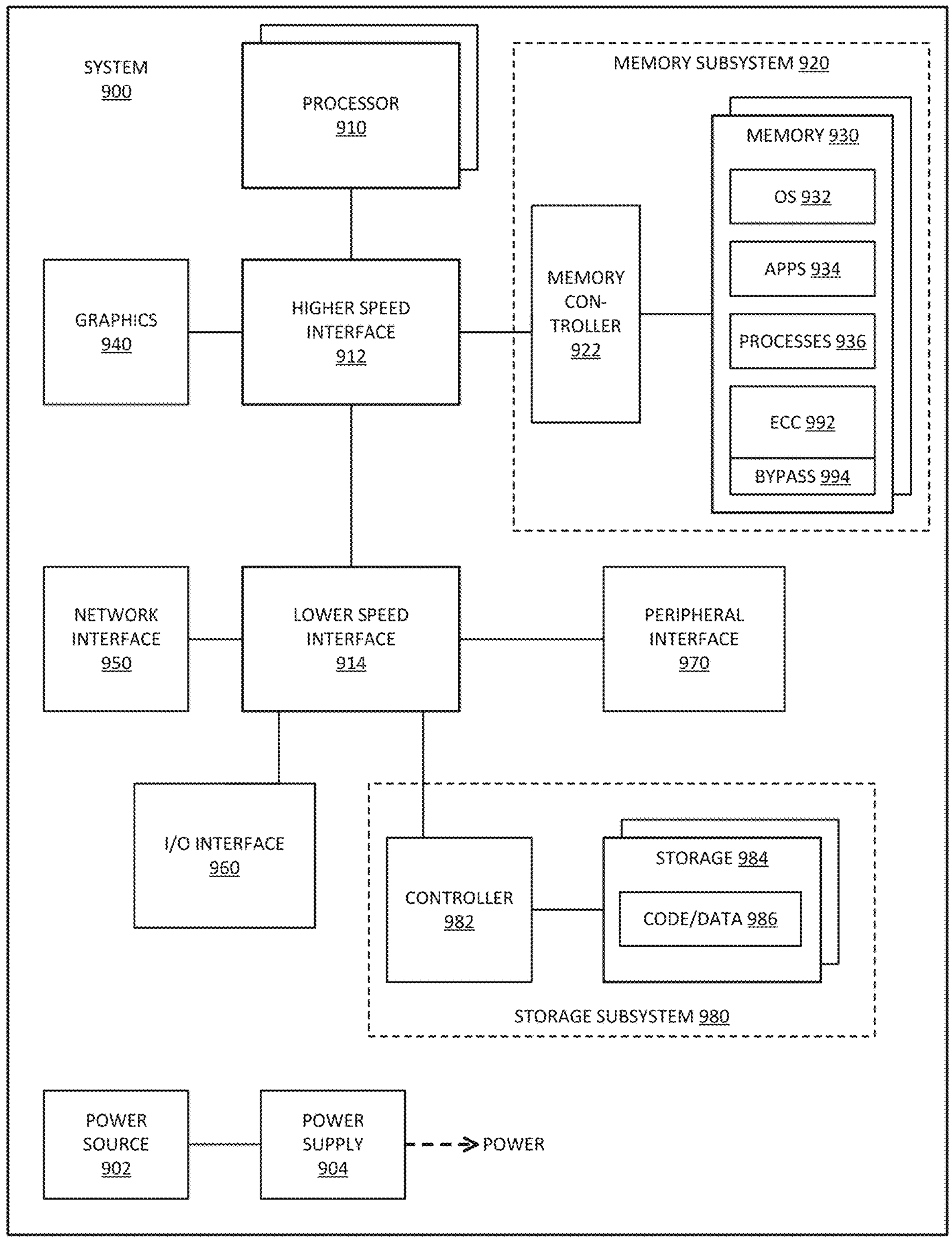
FIG. 9 is a block diagram of an example of a computing system in which selective on-die ECC bypass can be implemented.

FIG. 9 is a block diagram of an example of a computing system in which selective on-die ECC bypass can be implemented. System 900 represents a computing device in accordance with any example herein, and can be a laptop computer, a desktop computer, a tablet computer, a server, a gaming or entertainment control system, embedded computing device, or other electronic device. System 900 is one example of a system that can incorporate a system compatible with system 100 or system 200.

In one example, memory 930 includes on-die ECC 992 to perform ECC on read data prior to returning the data to memory controller 922. In one example, memory 930 includes bypass 994 to selectively bypass ECC 992. The bypassing of internal ECC can be in accordance with any description herein, where memory 930 performs a read in response to a retry command. Based on the retry command, memory 930 returns raw data from the memory array instead of performing ECC on the data prior to returning the data.

System 900 includes processor 910 can include any type of microprocessor, central processing unit (CPU), graphics processing unit (GPU), processing core, or other processing hardware, or a combination, to provide processing or execution of instructions for system 900. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 900 includes interface 912 coupled to processor 910, which can represent a higher speed interface or a high throughput interface for system components that need higher bandwidth connections, such as memory subsystem 920 or graphics interface components 940. Interface 912 represents an interface circuit, which can be a standalone component or integrated onto a processor die. Interface 912 can be integrated as a circuit onto the processor die or integrated as a component on a system on a chip. Where present, graphics interface 940 interfaces to graphics components for providing a visual display to a user of system 900. Graphics interface 940 can be a standalone component or integrated onto the processor die or system on a chip. In one example, graphics interface 940 can drive a high definition (HD) display or ultra high definition (UHD) display that provides an output to a user. In one example, the display can include a touchscreen display. In one example, graphics interface 940 generates a display based on data stored in memory 930 or based on operations executed by processor 910 or both.

Memory subsystem 920 represents the main memory of system 900, and provides storage for code to be executed by processor 910, or data values to be used in executing a routine. Memory subsystem 920 can include one or more memory devices 930 such as read-only memory (ROM), flash memory, one or more varieties of random access memory (RAM) such as DRAM, 3DXP (three-dimensional crosspoint), or other memory devices, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide software logic to provide functions for system 900. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910, such as integrated onto the processor die or a system on a chip.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 900 includes interface 914, which can be coupled to interface 912. Interface 914 can be a lower speed interface than interface 912. In one example, interface 914 represents an interface circuit, which can include standalone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces. Network interface 950 can exchange data with a remote device, which can include sending data stored in memory or receiving data to be stored in memory.

In one example, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 970 can include any hardware interface not specifically mentioned above. Peripherals refer generally to devices that connect dependently to system 900. A dependent connection is one where system 900 provides the software platform or hardware platform or both on which operation executes, and with which a user interacts.

In one example, system 900 includes storage subsystem 980 to store data in a nonvolatile manner. In one example, in certain system implementations, at least certain components of storage 980 can overlap with components of memory subsystem 920. Storage subsystem 980 includes storage device(s) 984, which can be or include any conventional medium for storing large amounts of data in a nonvolatile manner, such as one or more magnetic, solid state, 3DXP, or optical based disks, or a combination. Storage 984 holds code or instructions and data 986 in a persistent state (i.e., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (i.e., the value or state of the data is indeterminate if power is interrupted to system 900). In one example, storage subsystem 980 includes controller 982 to interface with storage 984. In one example controller 982 is a physical part of interface 914 or processor 910, or can include circuits or logic in both processor 910 and interface 914.

Power source 902 provides power to the components of system 900. More specifically, power source 902 typically interfaces to one or multiple power supplies 904 in system 900 to provide power to the components of system 900. In one example, power supply 904 includes an AC to DC (alternating current to direct current) adapter to plug into a wall outlet. Such AC power can be renewable energy (e.g., solar power) power source 902. In one example, power source 902 includes a DC power source, such as an external AC to DC converter. In one example, power source 902 or power supply 904 includes wireless charging hardware to charge via proximity to a charging field. In one example, power source 902 can include an internal battery or fuel cell source.

Figure 10:
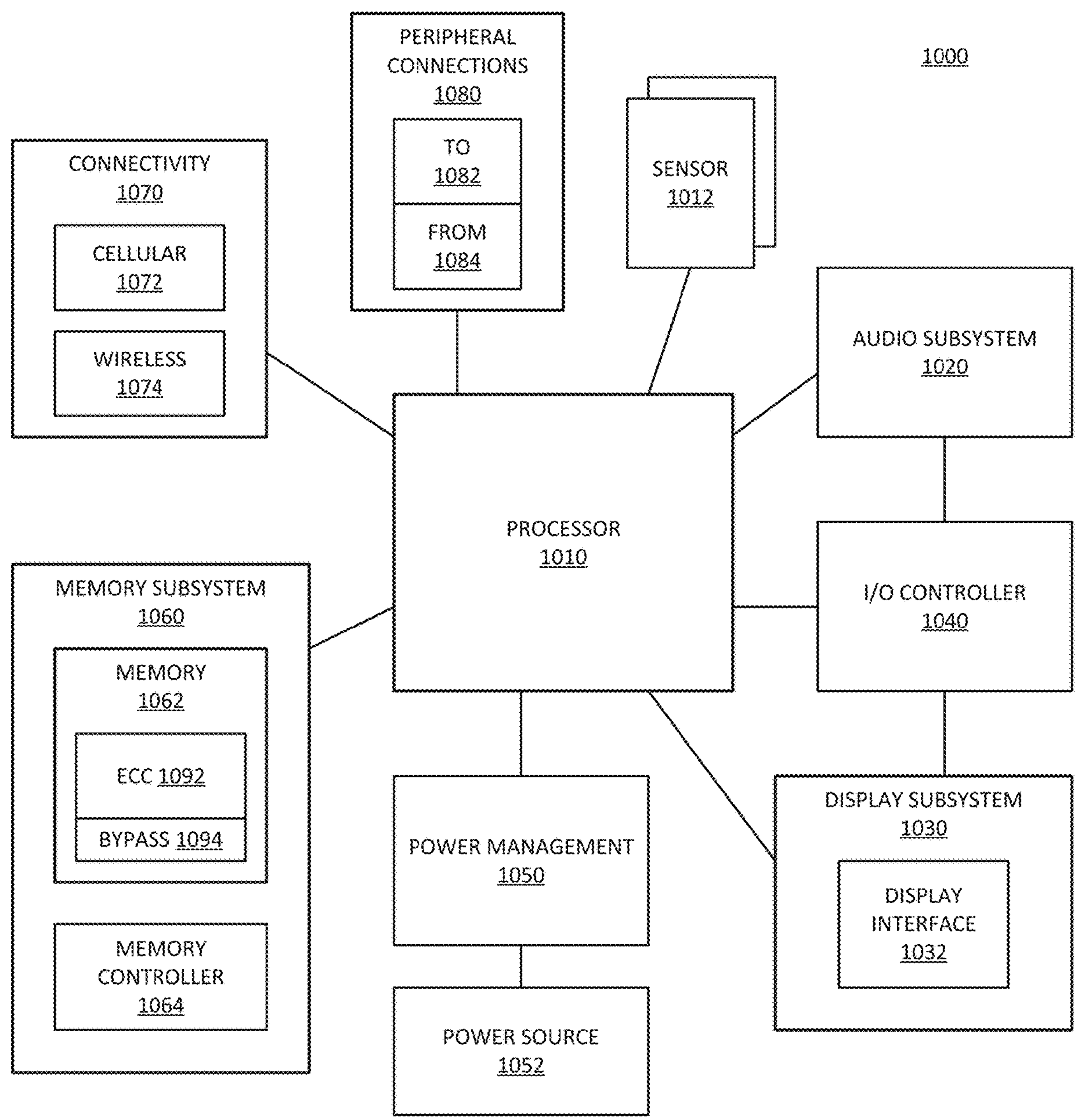
FIG. 10 is a block diagram of an example of a mobile device in which selective on-die ECC bypass can be implemented.

FIG. 10 is a block diagram of an example of a mobile device in which selective on-die ECC bypass can be implemented. System 1000 represents a mobile computing device, such as a computing tablet, a mobile phone or smartphone, wearable computing device, or other mobile device, or an embedded computing device. It will be understood that certain of the components are shown generally, and not all components of such a device are shown in system 1000. System 1000 is one example of a system that can incorporate a system compatible with system 100 or system 200.

In one example, memory 1062 includes on-die ECC 1092 to perform ECC on read data prior to returning the data to memory controller 1064. In one example, memory 1062 includes bypass 1094 to selectively bypass ECC 1092. The bypassing of internal ECC can be in accordance with any description herein, where memory 1062 performs a read in response to a retry command. Based on the retry command, memory 1062 returns raw data from the memory array instead of performing ECC on the data prior to returning the data.

System 1000 includes processor 1010, which performs the primary processing operations of system 1000. Processor 1010 can include one or more physical devices, such as microprocessors, application processors, microcontrollers, programmable logic devices, or other processing means. The processing operations performed by processor 1010 include the execution of an operating platform or operating system on which applications and device functions are executed. The processing operations include operations related to I/O (input/output) with a human user or with other devices, operations related to power management, operations related to connecting system 1000 to another device, or a combination. The processing operations can also include operations related to audio I/O, display I/O, or other interfacing, or a combination. Processor 1010 can execute data stored in memory. Processor 1010 can write or edit data stored in memory.

In one example, system 1000 includes one or more sensors 1012. Sensors 1012 represent embedded sensors or interfaces to external sensors, or a combination. Sensors 1012 enable system 1000 to monitor or detect one or more conditions of an environment or a device in which system 1000 is implemented. Sensors 1012 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1012 can also include sensors for biometric systems such as fingerprint recognition systems, face detection or recognition systems, or other systems that detect or recognize user features. Sensors 1012 should be understood broadly, and not limiting on the many different types of sensors that could be implemented with system 1000. In one example, one or more sensors 1012 couples to processor 1010 via a frontend circuit integrated with processor 1010. In one example, one or more sensors 1012 couples to processor 1010 via another component of system 1000.

In one example, system 1000 includes audio subsystem 1020, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 1000, or connected to system 1000. In one example, a user interacts with system 1000 by providing audio commands that are received and processed by processor 1010.

Display subsystem 1030 represents hardware (e.g., display devices) and software components (e.g., drivers) that provide a visual display for presentation to a user. In one example, the display includes tactile components or touchscreen elements for a user to interact with the computing device. Display subsystem 1030 includes display interface 1032, which includes the particular screen or hardware device used to provide a display to a user. In one example, display interface 1032 includes logic separate from processor 1010 (such as a graphics processor) to perform at least some processing related to the display. In one example, display subsystem 1030 includes a touchscreen device that provides both output and input to a user. In one example, display subsystem 1030 includes a high definition (HD) or ultra-high definition (UHD) display that provides an output to a user. In one example, display subsystem includes or drives a touchscreen display. In one example, display subsystem 1030 generates display information based on data stored in memory or based on operations executed by processor 1010 or both.

I/O controller 1040 represents hardware devices and software components related to interaction with a user. I/O controller 1040 can operate to manage hardware that is part of audio subsystem 1020, or display subsystem 1030, or both. Additionally, I/O controller 1040 illustrates a connection point for additional devices that connect to system 1000 through which a user might interact with the system. For example, devices that can be attached to system 1000 might include microphone devices, speaker or stereo systems, video systems or other display device, keyboard or keypad devices, buttons/switches, or other I/O devices for use with specific applications such as card readers or other devices.

As mentioned above, I/O controller 1040 can interact with audio subsystem 1020 or display subsystem 1030 or both. For example, input through a microphone or other audio device can provide input or commands for one or more applications or functions of system 1000. Additionally, audio output can be provided instead of or in addition to display output. In another example, if display subsystem includes a touchscreen, the display device also acts as an input device, which can be at least partially managed by I/O controller 1040. There can also be additional buttons or switches on system 1000 to provide I/O functions managed by I/O controller 1040.

In one example, I/O controller 1040 manages devices such as accelerometers, cameras, light sensors or other environmental sensors, gyroscopes, global positioning system (GPS), or other hardware that can be included in system 1000, or sensors 1012. The input can be part of direct user interaction, as well as providing environmental input to the system to influence its operations (such as filtering for noise, adjusting displays for brightness detection, applying a flash for a camera, or other features).

In one example, system 1000 includes power management 1050 that manages battery power usage, charging of the battery, and features related to power saving operation. Power management 1050 manages power from power source 1052, which provides power to the components of system 1000. In one example, power source 1052 includes an AC to DC (alternating current to direct current) adapter to plug into a wall outlet. Such AC power can be renewable energy (e.g., solar power, motion based power). In one example, power source 1052 includes only DC power, which can be provided by a DC power source, such as an external AC to DC converter. In one example, power source 1052 includes wireless charging hardware to charge via proximity to a charging field. In one example, power source 1052 can include an internal battery or fuel cell source.

Memory subsystem 1060 includes memory device(s) 1062 for storing information in system 1000. Memory subsystem 1060 can include nonvolatile (state does not change if power to the memory device is interrupted) or volatile (state is indeterminate if power to the memory device is interrupted) memory devices, or a combination. Memory 1060 can store application data, user data, music, photos, documents, or other data, as well as system data (whether long-term or temporary) related to the execution of the applications and functions of system 1000. In one example, memory subsystem 1060 includes memory controller 1064 (which could also be considered part of the control of system 1000, and could potentially be considered part of processor 1010). Memory controller 1064 includes a scheduler to generate and issue commands to control access to memory device 1062.

Connectivity 1070 includes hardware devices (e.g., wireless or wired connectors and communication hardware, or a combination of wired and wireless hardware) and software components (e.g., drivers, protocol stacks) to enable system 1000 to communicate with external devices. The external device could be separate devices, such as other computing devices, wireless access points or base stations, as well as peripherals such as headsets, printers, or other devices. In one example, system 1000 exchanges data with an external device for storage in memory or for display on a display device. The exchanged data can include data to be stored in memory, or data already stored in memory, to read, write, or edit data.

Connectivity 1070 can include multiple different types of connectivity. To generalize, system 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 1074 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1080 include hardware interfaces and connectors, as well as software components (e.g., drivers, protocol stacks) to make peripheral connections. It will be understood that system 1000 could both be a peripheral device ("to" 1082) to other computing devices, as well as have peripheral devices ("from" 1084) connected to it. System 1000 commonly has a "docking" connector to connect to other computing devices for purposes such as managing (e.g., downloading, uploading, changing, synchronizing) content on system 1000. Additionally, a docking connector can allow system 1000 to connect to certain peripherals that allow system 1000 to control content output, for example, to audiovisual or other systems.

In addition to a proprietary docking connector or other proprietary connection hardware, system 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example, a memory controller includes: a hardware interface to couple to a memory device; and command logic to generate a retry command for the memory device; wherein the retry command is to trigger the memory device to return read data without application of error checking and correction (ECC) by ECC circuitry of the memory device.

In one example, the command logic is to generate a command having a command encoding to indicate the retry command. In one example, the command logic is to generate a sequence of back-to-back read commands to a same address to indicate the retry command. In one example, the command logic is to generate a mode register write command to set a mode register of the memory device to a retry command mode; wherein the command logic is to generate a read command to send while the memory device is in the retry command mode to indicate the retry command. In one example, the command logic is to generate the retry command in response to receipt of error data received in response to a prior read command. In one example, the hardware interface is to receive an indication of a detected, uncorrectable error (DUE) from the memory device in response to the prior read command, and wherein the command logic is to generate the retry command in response to the indication of the DUE from the memory device. In one example, the memory device comprises a synchronous dynamic random access memory (SDRAM) device compatible with a double data rate (DDR) standard.

In general with respect to the descriptions herein, in one example, a memory device includes: error checking and correction (ECC) circuitry to receive read data, apply ECC to the read data internally to the memory device, and return corrected data in response to a read command; and a hardware interface to receive a retry command after the read command, wherein in response to the retry command the hardware interface is to return the read data without application of ECC by the ECC circuitry.

In one example, the retry command comprises a command having a command encoding to indicate the retry command. In one example, the retry command comprises a sequence of read commands without other intervening commands. In one example, the memory device further includes a register to store an address of the read command, wherein the memory device is to decode the sequence of read commands as the retry command when the address of the read command stored in the register matches an address of a subsequent read command sent without other intervening commands. In one example, the memory device further includes: a mode register to store a field to indicate a retry command mode; wherein the retry command comprises a read command received in the retry command mode. In one example, the hardware interface is to bypass the ECC circuitry to return the read data without application of ECC. In one example, the ECC circuitry is to indicate a detected, uncorrectable error (DUE) to a host, to trigger the host to send the retry command. In one example, the memory device comprises a synchronous dynamic random access memory (SDRAM) device compatible with a double data rate (DDR) standard.

In general with respect to the descriptions herein, in one example, a system includes: a memory device having error checking and correction (ECC) circuitry to internally apply ECC to read data in response to a read command, and return corrected data in response to the read command; and a memory controller having command logic to generate the read command, and generate a retry command after the read command; wherein the retry command is to trigger the memory device to return read data without application of ECC by the ECC circuitry of the memory device.

In one example, the retry command comprises a command having a command encoding to indicate the retry command. In one example, the retry command comprises a sequence of read commands without other intervening commands, wherein the memory device is to decode the sequence of read commands as the retry command. In one example, the memory device further comprising a mode register to store a field to indicate a retry command mode; wherein the memory controller is to send a read command while the memory device is in the retry command mode to indicate the retry command. In one example, the memory device comprises a synchronous dynamic random access memory (SDRAM) device compatible with a double data rate (DDR) standard. In one example, the system further includes one or more of: a host processor device coupled to the memory controller; a display communicatively coupled to a host processor; a network interface communicatively coupled to a host processor; or a battery to power the system.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device comprising:

a hardware interface to receive a first read command for an address from a host; and on-die error checking and correction (ECC) circuitry to receive read data, process the read data internally to the memory device with the on-die ECC circuitry to generate ECC processed read data, and return the ECC processed read data from the address to the host in response to the first read command, wherein in response to detection of a detected, uncorrectable error (DUE) by the on-die ECC circuitry, the on-die ECC circuitry is also to return a DUE indication to the host in response to the first read command;

wherein the hardware interface is to receive a second read command from the host to the address subsequent to the first read command, in response to the DUE indication; and wherein the second read command is to disable application of the on-die ECC circuitry, to trigger the memory device to return the read data from the address not processed by the on-die ECC circuitry in response to the second read command.

2. The memory device of claim 1, wherein the second read command comprises a command having a command encoding to trigger disabling of the application of the on-die ECC circuitry.

3. The memory device of claim 1, wherein the second read command comprises a sequence of read commands to the address without other intervening commands to trigger disabling of the application of the on-die ECC circuitry.

4. The memory device of claim 3, further comprising a register to store the address.

5. The memory device of claim 1, further comprising:

a mode register to store a field to indicate application of on-die ECC;

wherein the second read command comprises a read command received when the field indicates application of the on-die ECC is disabled.

6. The memory device of claim 1, wherein to disable application of the on-die ECC circuitry comprises a bypass of the on-die ECC circuitry in response to the second read command.

7. The memory device of claim 1, wherein the memory device comprises one of multiple memory devices coupled in parallel, and wherein after the second read command, the hardware interface is to receive a command to trigger performance of permanent fault detection (PFD) to determine which of multiple memory devices generated the DUE indication.

8. The memory device of claim 1, wherein the memory device comprises a synchronous dynamic random access memory (SDRAM) device compatible with a double data rate (DDR) standard.

9. A method for a memory device, comprising:

returning a detected, uncorrectable error (DUE) indication from on-die error checking and correction (ECC) in response to a first read command for an address;

receiving a second read command for the address in response to the DUE indication;

disabling application of the on-die ECC in response to the second read command; and returning raw data from the address without application of the on-die ECC in response to the second read command.

10. The method of claim 9, wherein receiving the second read command comprises decoding the command to identify the command as a read command without application of the on-die ECC.

11. The method of claim 10, wherein identifying the command comprises identifying command encoding to trigger disabling of the application of the on-die ECC.

12. The method of claim 10, wherein identifying the command comprises identifying the command as a second of a sequence of read commands to the address without other intervening commands.

13. The method of claim 10, wherein identifying the command comprises identifying a read command received when a field in a mode register indicates disabling application of the on-die ECC.

14. The method of claim 9, wherein disabling application of the on-die ECC comprises bypassing on-die ECC circuitry in response to the second read command.

15. A method for a memory controller comprising:

receiving an indication of a detected, uncorrectable error (DUE) indication from a memory device with on-die error checking and correction (ECC) in response to a first read command for an address;

sending a second read command to the memory device for the address in response to the DUE indication, the second read command to trigger disabling application of the on-die ECC; and receiving raw data from the address without application of the on-die ECC in response to the second read command.

16. The method of claim 15, wherein sending the second read command comprises sending a command having a command encoding to trigger disabling of the application of the on-die ECC.

17. The method of claim 15, wherein sending the second read command comprises sending the second read command as a second of a sequence of read commands to the address without other intervening commands.

18. The method of claim 15, wherein sending the second read command comprises:

writing a field of a mode register of the memory device to indicate application of the on-die ECC is disabled; and sending the second read command when the field indicates the application of the on-die ECC is disabled.

19. The method of claim 15, wherein triggering disabling of the application of the on-die ECC comprises triggering a bypass of on-die ECC circuitry in response to the second read command.

20. The method of claim 15, wherein the memory device comprises one of multiple memory devices coupled in parallel, and further comprising performing permanent fault detection (PFD) to determine which of the multiple memory devices generated the DUE indication.

* * * * *